United States Patent
Makino

(10) Patent No.: US 8,835,081 B2
(45) Date of Patent: Sep. 16, 2014

(54) POLYMERIZABLE COMPOSITION, COLOR FILTER, METHOD OF PRODUCING COLOR FILTER AND SOLID-STATE IMAGE SENSOR

(75) Inventor: Masaomi Makino, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 112 days.

(21) Appl. No.: 13/509,189

(22) PCT Filed: Jan. 25, 2011

(86) PCT No.: PCT/JP2011/051847
§ 371 (c)(1),
(2), (4) Date: May 10, 2012

(87) PCT Pub. No.: WO2011/093479
PCT Pub. Date: Aug. 4, 2011

(65) Prior Publication Data
US 2012/0236426 A1    Sep. 20, 2012

(30) Foreign Application Priority Data

Jan. 29, 2010    (JP) .................................. 2010-19379

(51) Int. Cl.
*G02B 5/20* (2006.01)
*G03F 7/004* (2006.01)

(52) U.S. Cl.
USPC ........................................... 430/7; 430/270.1

(58) Field of Classification Search
None
See application file for complete search history.

(56) References Cited

U.S. PATENT DOCUMENTS

| | | | |
|---|---|---|---|
| 4,255,513 A | 3/1981 | Laridon et al. | |
| 4,590,145 A | 5/1986 | Itoh et al. | |
| 2008/0076044 A1* | 3/2008 | Mizukawa et al. | ........... 430/7 |
| 2009/0023085 A1* | 1/2009 | Tsuchimura | ................ 430/7 |
| 2009/0246651 A1 | 10/2009 | Fujimori et al. | |
| 2010/0104976 A1 | 4/2010 | Sasaki | |
| 2010/0230647 A1 | 9/2010 | Mizukawa et al. | |
| 2012/0138877 A1 | 6/2012 | Mizukawa et al. | |
| 2012/0238752 A1 | 9/2012 | Mizukawa et al. | |

FOREIGN PATENT DOCUMENTS

| | | | |
|---|---|---|---|
| EP | 1 826 200 A2 | 8/2007 | |
| JP | 2000-080068 A | 3/2000 | |
| JP | 2001-233842 A | 8/2001 | |
| JP | 2005-202252 A | 7/2005 | |
| JP | 2006-342166 A | 12/2006 | |
| JP | 2007-269779 A | 10/2007 | |
| JP | 2008-083416 A | 4/2008 | |
| JP | 2008-089713 A | 4/2008 | |
| JP | 2008292970 A | 12/2008 | |
| JP | 2009-191061 A | 8/2009 | |
| JP | 2009-244414 A | 10/2009 | |
| JP | 2009-286976 A | 12/2009 | |
| JP | 2011-105713 A | 6/2011 | |
| WO | 2009/131189 A | 10/2009 | |
| WO | 2010/001733 A1 | 1/2010 | |

OTHER PUBLICATIONS

Decision of Refusal, dated Jul. 2, 2013, issued in corresponding JP Application No. 2010-019379, 3 pages in English and Japanese.
Notice of Reasons for Rejection, dated Jul. 24, 2012, issued in corresponding JP Application No. 2010-019379, 8 pages in English and Japanese.
Notice of Reasons for Rejection, dated Feb. 26, 2013, issued in corresponding JP Application No. 2010-019379, 4 pages in English and Japanese.
Extended European Search Report dated Jul. 2, 2014 in European Patent Application 11737188.0.

* cited by examiner

Primary Examiner — John A. McPherson
(74) Attorney, Agent, or Firm — Sughrue Mion, PLLC

(57) ABSTRACT

The present invention provides a polymerizable composition including (A) a photoradical polymerization initiator represented by following Formula (1), the photoradical polymerization initiator having a molar absorption coefficient with respect to light at a wavelength of 365 nm in ethyl acetate of from 4,000 to less than 10,000; (B) a polymerizable compound; and (C) a colorant. In Formula (1), X represents $CH_2$, S etc., $R^1$ represents a halogen atom, a nitro group, a cyano group etc., $R^2$ represents an alkyl group, an aryl group etc., and $R^3$ represents a hydrogen atom, —SRa (Ra is an alkyl group etc.) etc.

Formula (1)

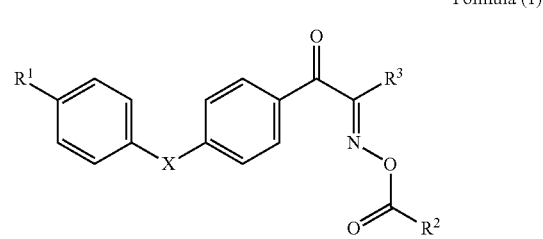

13 Claims, No Drawings

POLYMERIZABLE COMPOSITION, COLOR FILTER, METHOD OF PRODUCING COLOR FILTER AND SOLID-STATE IMAGE SENSOR

CROSS REFERENCE TO RELATED APPLICATION

This application is a National Stage of International Application No. PCT/JP2011/051847 filed Jan. 25, 2011, claiming priority based on Japanese Patent Application No. 2009-19379 filed Jan. 29, 2010, the contents of all of which are incorporated herein by reference in their entirety.

TECHNICAL FIELD

The present invention relates to a polymerizable composition, a color filter made from the polymerizable composition, a method of producing the color filter, and a solid-state image sensor including the color filter.

BACKGROUND ART

There are polymerizable compositions that include, for example, a polymerizable compound having an ethylenically unsaturated bond and a photopolymerization initiator. Since such polymerizable compositions cure when exposed to light, they are used for photocurable inks, photosensitive printing plates, color filters, photoresists and the like.

In recent years, combined with the demand in various applications for polymerizable compositions having sensitivity with respect to a short wavelength light of especially 365 nm, compounds that exhibit excellent sensitivity with respect to a light source of short wavelength, for example, a photopolymerization initiator, have been increasingly desired. However, since photopolymerization initiators that exhibit excellent sensitivity are generally poor in stability, photopolymerization initiators having sufficient storage stability in addition to improved sensitivity have been demanded.

Use of oxime ester derivatives as a photopolymerization initiator in such polymerizable compositions has been proposed (see, for example, U.S. Pat. Nos. 4,255,513 and 4,590,145, Japanese Patent Application Laid-Open (JP-A) Nos. 2000-80068, 2001-233842, 2006-342166 and 2005-202252). However, since these known oxime ester compounds exhibit low absorbance with respect to light having a wavelength of 365 nm, there has been room to improve the exposure sensitivity with respect to light of this wavelength.

In view of the above, novel oxime ester derivatives, which exhibit increased absorbance with respect to short wavelength light of approximately 365 nm, improved sensitivity and favorable stability, have been proposed in recent years (see, for example, JP-A Nos. 2007-269779 and 2009-191061).

Use of polymerizable compositions utilizing these oxime ester compounds as an initiator for a colored radiation-sensitive composition that forms a colored region for a color filter has also been proposed (see, for example, JP-A No. 2005-202252). However, these compositions remain insufficient in terms of storage stability and sensitivity with respect to short wavelength light.

Use of a polymerizable composition for forming a colored region for a color filter newly creates a need to realize favorable reproducibility of color hue after the formation of a pattern, and a solution to problems such as changes in coloring property over time has been strongly desired.

There is also a strong demand for increasing the color density and reducing the thickness of color filters for image sensors for the purpose of enhancing the light-condensing capability of a solid-state image sensor such as a CCD image sensor or improving the image quality by enhancing the color-separation capability of the solid-state image sensor. In this regard, when a large amount of colorant is added to the composition in order to achieve high color density, sensitivity may not be sufficient to precisely reproduce the shape of fine pixel patterns having a size of 2.5 μm or less. As a result, there is a tendency for a lack of patterns to occur frequently in the entire region. In order to prevent the lack of patterns, the light exposure needs to be carried out with energy of a higher level. Therefore, the time for exposure may become longer and decrease in yield of products may be significant.

In consideration of the above, there is a need for polymerizable compositions used for forming a colored region of a color filter that exhibit high curing sensitivity, while containing a colorant at high concentration, in order to attain an ability of forming a favorable pattern.

DISCLOSURE OF THE INVENTION

Technical Problem

A first aspect of the invention is to provide a polymerizable composition that exhibits improved light absorption coefficient with respect to light at a wavelength of 365 nm, improved radical generation quantum yield and the like, the composition being capable of curing at high sensitivity and forming a cured film having excellent intra-film curability.

A second aspect of the invention is to provide a polymerizable composition for forming a colored region of a color filter, the composition being capable of forming a color pattern that cures at high sensitivity and exhibits excellent adhesion with respect to a support, and whose change in color after development is suppressed even after being heated.

A third aspect of the invention is to provide a color filter formed from the polymerizable composition according to the first aspect, the color filter having a favorable pattern shape and excellent adhesion with respect to a support; a method of producing the color filter at high yield; and a solid-state image sensor including the color filter.

Solution to Problem

The inventors have made intense study and, as a result, succeeded in providing a polymerizable composition that exhibits an excellent balance between curing sensitivity and intra-film curability and does not turn yellow even when it is heated after development, based on the findings that such a polymerizable composition can be obtained by using, as a photopolymerization initiator, an oxime compound having a specific structure and a light absorption coefficient with respect to light having a wavelength of 365 nm, more preferably in combination with a specific colorant.

The following are exemplary embodiments of the invention. However, the invention is not limited to these exemplary embodiments.

<1> A polymerizable composition comprising (A) a photoradical polymerization initiator represented by following Formula (1), the photoradical polymerization initiator having a molar absorption coefficient with respect to light at a wavelength of 365 nm in ethyl acetate of from 4,000 to less than 10,000; (B) a polymerizable compound; and (C) a colorant:

Formula (1)

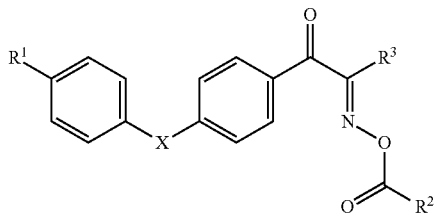

wherein, in Formula (1), X represents $CH_2$, O or S; $R^1$ represents a halogen atom, a nitro group, a cyano group, or a substituent represented by following Formula (2), Formula (3) or Formula (4); $R^2$ represents an alkyl group, an aryl group, a heteroaryl group, an alkoxy group, an aryloxy group or a heteroaryloxy group; $R^3$ represents a hydrogen atom or an alkyl group having at least one substituent selected from the group consisting of a cyano group, an alkenyl group, an alkynyl group, —SRa, —CONRaRb, —OC(O)NRaRb, —OC(O)Ra, —C(O)ORa, —S(O)Ra and —S(O)$_2$Ra, wherein Ra and Rb each independently represent a hydrogen atom, an alkyl group, an aryl group or a heteroaryl group:

Formula (2)

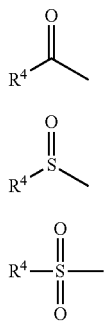

Formula (3)

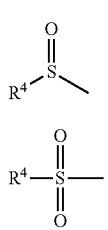

Formula (4)

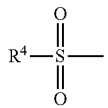

wherein, in Formulae (2) to (4), $R^4$ represents an alkyl group, an aryl group, a heteroaryl group, a hydroxyl group, an alkoxy group, an aryloxy group, a heteroaryloxy group or an amino group.

<2> The polymerizable composition according to <1>, wherein (A) the photoradical polymerizable initiator comprises a compound represented by following Formula (5):

Formula (5)

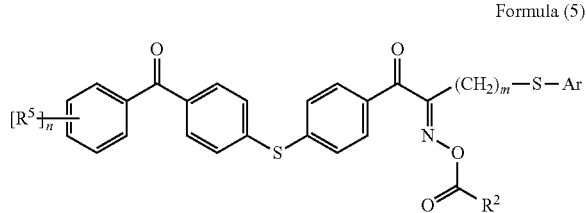

wherein, in Formula (5), $R^2$ represents an alkyl group, an aryl group, a heteroaryl group, an alkoxy group, an aryloxy group or a heteroaryloxy group; $R^5$ represents a halogen atom, an alkyl group, an alkoxy group or an amino group; Ar represents an aryl group; n represents an integer of from 0 to 3; and m represents an integer of from 1 to 3.

<3> The polymerizable composition according to <1> or <2>, wherein (C) the colorant comprises a dye including zinc.

<4> The polymerizable composition according to <1> or <2>, wherein (C) the colorant comprises a pigment including zinc.

<5> The polymerizable composition according to <1> or <2>, wherein (C) the colorant comprises titanium black.

<6> The polymerizable composition according to <4> or <5>, further comprising (D) a pigment dispersant.

<7> The polymerizable composition according to any one of <1> to <6>, for use in forming a colored region of a color filter.

<8> A color filter comprising a support and a colored region, the colored region being formed from the polymerizable composition according to any one of <1> to <6>.

<9> A method of producing a color filter, the method comprising:

forming a polymerizable composition layer by applying the polymerizable composition according to any one of <1> to <6> on a support;

exposing the polymerizable composition layer to light in a patterned manner; and forming a color pattern by developing the polymerizable composition layer that has been exposed to light.

<10> A solid-state image sensor comprising the color filter according to <8>.

Advantageous Effects of the Invention

According to the invention, it is possible to provide a polymerizable composition that exhibits improved light absorption coefficient with respect to light at a wavelength of 365 nm, improved radical generation quantum yield and the like, the composition being capable of curing at high sensitivity and forming a cured film having excellent intra-film curability; a polymerizable composition for forming a colored region of a color filter, the composition being capable of forming a color pattern that cures at high sensitivity and exhibits excellent adhesion with respect to a support and suppressed coloration even after being heated after the development; a color filter formed from the polymerizable composition according to the invention, the color filter having a favorable pattern shape and excellent adhesion with respect to a support; a method of producing the color filter at high yield; and a solid-state image sensor including the color filter.

<<Polymerizable Composition>>

The polymerizable composition of the present invention contains (A) a radical photopolymerization initiator represented by Formula (1), the photoradical polymerization initiator having a molar absorption coefficient with respect to light having a wavelength of 365 nm in ethyl acetate of 4000 or more and less than 10000; a (B) polymerizable compound; and a (C) colorant.

Hereinafter, the components used in the polymerizable composition of the invention will be described.

<(A) Radical Photopolymerization Initiator>

The (A) radical photopolymerization initiator used in the invention has a function of decomposing by light, and initiating and promoting polymerization of a polymerizable compound. In particular, since the radical photopolymerization initiator of the invention has a high sensitivity with respect to light at 365 nm, it demonstrates excellent effects when used as a photopolymerization initiator in a polymerizable composition.

The (A) radical photopolymerization initiator used in the invention is a compound represented by Formula (1), which compound has a molar absorption coefficient to light having a wavelength of 365 nm in ethyl acetate of 4000 or more and less than 10000. In the present specification, the (A) radical photopolymerization initiator is also referred to as a "specific oxime compound".

Formula (1)

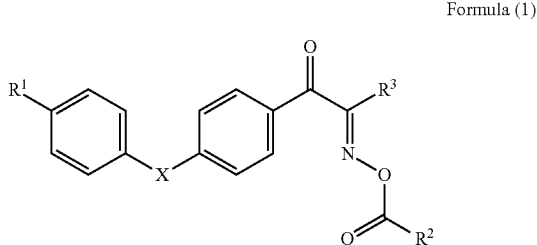

In Formula 1, X represents $CH_2$, O or S. $R^1$ represents a halogen atom, a nitro group, a cyano group, or a substituent represented by following Formula (2), Formula (3) or Formula (4). $R^2$ represents an alkyl group, an aryl group, a heteroaryl group, an alkoxy group, an aryloxy group, or a heteroaryloxy group. $R^3$ represents a hydrogen atom or an alkyl group having at least one substituent selected from following Group (A).

Formula (2)

Formula (3)

Formula (4)

In Formulae (2) to (4), $R^4$ represents an alkyl group, an aryl group, a heteroaryl group, a hydroxyl group, an alkoxy group, an aryloxy group, a heteroaryloxy group, or an amino group.

Group (A)

The substituents in Group (A) are a cyano group, an alkenyl group, an alkynyl group, —SRa, —CONRaRb, —OC(O)NRaRb, —OC(O)Ra, —C(O)ORa, —S(O)Ra, and —S(O)$_2$Ra, in which Ra and Rb each independently represent a hydrogen atom, an alkyl group, an aryl group, or a heteroaryl group.

In the present specification, unless otherwise specified, the alkyl group, aryl group, heteroaryl group, alkoxy group, aryloxy group, heteroaryloxy group, amino group, alkenyl group, and alkynyl group include those having no substituent and those having a further substituent.

—Molar Absorption Coefficient of (A) Radical Photopolymerization Initiator—

In the (A) radical photopolymerization initiator in the invention, the molar absorption coefficient to light having a wavelength of 365 nm in ethyl acetate needs to be 4000 or more and less than 10000.

The range of the molar absorption coefficient at a wavelength of 365 nm is preferably 4000 or more and less than 10000, more preferably 4000 or more and less than 7000, and still more preferably 5000 or more and less than 6000.

When the molar absorption coefficient is less than 4000, the amount of light absorbed by the radical photopolymerization initiator may decrease, and the sensitivity may remarkably decrease. When the molar absorption coefficient is 10000 or more, there is concern that the absorption by the radical photopolymerization initiator may occur only at a surface of a cured film, whereby curability in internal portions may decrease and adhesion between the formed cured film and a support may be insufficient. Further, absorption at 400 nm may also occur as the absorption at 365 nm increases, and yellowing of an initiator itself or yellowing of the cured film after being subjected to heat treatment after development tends to occur.

More specifically, in the polymerizable composition of the invention, when the molar absorption coefficient of the (A) radical photopolymerization initiator is in the range of from 4000 or more and less than 10000, a favorable balance between the curing sensitivity and the intra-film curability may be achieved, a favorable adhesion of the obtained cured film to a support may be achieved, and coloration of the cured film due to heat treatment after development may be suppressed. The structure of the photopolymerization initiator that achieves a molar absorption coefficient as mentioned above preferably has, for example, a functional group having a relatively low electron donating property as X in Formula (1). From this point of view, X is preferably selected from —$CH_2$—, O or S. In contrast, when X contains a nitrogen atom in Formula (1), the electron donating property is relatively high. Therefore, the absorbance tends to be high, and this is not preferred in the invention. Furthermore, when X in Formula (1) is a single bond or when the adjacent two aromatic rings are bonded to each other to form a condensed ring structure without having X therebetween, the length of the conjugated chain may extend and the absorption wavelength may become longer, whereby the absorbance tends to become higher, and this is also not preferred in the invention.

The molar absorption coefficient of the (A) specific oxime compound in the present specification refers to a value measured with an ultraviolet and visible spectrophotometer (CARRY-5 SPECTROPHOTOMETER, trade name, manufactured by Varian) and ethyl acetate (manufactured by Wako Pure Chemical Industries, Ltd., a solvent for spectroscopic analysis) at a concentration of 0.01 g/L.

Hereinafter, details of the compound represented by Formula (1) will be described.

In Formula (1), X represents $CH_2$, O or S, preferably O or S, more preferably S.

$R^1$ represents a halogen atom, a nitro group, a cyano group, or a substituent represented by Formula (2), Formula (3) or Formula (4). Examples of the halogen atom include a fluorine atom, a chlorine atom, a bromine atom and an iodine atom. $R^1$ is preferably a substituent represented by Formula (2).

In the substituent represented by Formula (2), Formula (3) or Formula (4), $R^4$ represents an alkyl group, an aryl group, a heteroaryl group, a hydroxyl group, an alkoxy group, an aryloxy group, a heteroaryloxy group, or an amino group.

$R^4$ is preferably an alkyl group, an aryl group or a heteroaryl group, more preferably an aryl group.

Specifically, the structure in which $R^1$ is a substituent represented by Formula (2) and $R^4$ is an aryl group is most preferred.

$R^2$ is an alkyl group, an aryl group, a heteroaryl group, an alkoxy group, an aryloxy group, or a heteroaryloxy group.

When $R^2$ and $R^4$ represent an alkyl group, the alkyl group which may have a substituent is preferably an alkyl group having 1 to 30 carbon atoms, more preferably an alkyl group having 1 to 20 carbon atoms, and still more preferably an alkyl group having 1 to 10 carbon atoms.

Specific examples of the alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a cyclopentyl group, a cyclohexyl group, a trifluoromethyl group, a 2-ethylhexyl group, a phenacyl group, a 1-naphthoyl methyl group, 2-naphthoyl methyl group, an allyl group, and a propargyl group.

Among these specific examples, a methyl group, an isopropyl group and a t-butyl group are preferred as the alkyl group.

When $R^2$ and $R^4$ represent an aryl group, the aryl group which may have a substituent is preferably an aromatic ring having 6 to 30 carbon atoms, more preferably an aromatic ring having 6 to 20 carbon atoms, and still more preferably an aromatic ring having 6 to 10 carbon atoms.

Specific examples of the aryl group include a phenyl group, a p-methoxyphenyl group, a p-fluorophenyl group, a p-bromophenyl group, a pentafluorophenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, o-, m-, and p-tolyl groups, a xylyl group, o-, m-, and p-cumenyl groups, a mesityl group, a pentalenyl group, a binaphthalenyl group, a ter-naphthalenyl group, a biphenylenyl group, an indacenyl group, a fluoranthenyl group, an acenaphthylenyl group, a fluorenyl group, an anthryl group, a bianthracenyl group, a teranthracenyl group, an anthraquinolyl group, a phenanthryl group, and a triphenylenyl group.

Among these specific examples, a phenyl group, o-, m-, and p-tolyl groups, a p-methoxyphenyl group, a p-fluorophenyl group, a p-bromophenyl group, a pentafluorophenyl group, or a 2-naphthyl group is more preferred, and a phenyl group is still more preferred.

When $R^2$ and $R^4$ represent a heteroaryl group, examples of the heteroaryl group which may have a substituent include an aromatic or aliphatic heterocyclic group having a nitrogen atom, an oxygen atom, a sulfur atom, or a phosphorous atom. In particular, a carbazolyl group, a thienyl group, a pyridyl group, a furyl group, a pyranyl group and an imidazolyl group are preferred, and a thienyl group, a pyridyl group and a furyl group are more preferred.

When $R^2$ and $R^4$ represent an alkoxy group, the alkoxy group refers to a group in which an alkyl group that may have a substituent has an oxygen atom at the end portion of the alkyl group. Preferable specific examples of the alkyl group in this case are the same as the alkyl group described above.

When $R^2$ and $R^4$ represent an aryloxy group, the aryloxy group refers to a group in which an aryl group that may have a substituent has an oxygen atom at the end portion of the aryl group. Preferable specific examples of the aryl group in this case are the same as the aryl group described above.

When $R^2$ and $R^4$ represent a heteroaryloxy group, the heteroaryloxy group refers to a group in which a heteroaryl group that may have a substituent has an oxygen atom at the end portion of the heteroaryl group. Preferable specific examples of the heteroaryl group in this case are the same as the heteroaryl group described above.

When the alkyl group and the like as described above further have a substituent, examples of the substituent that can be introduced include a phenyl group, o-, m-, and p-tolyl groups, a naphthyl group, a methoxy group, an ethoxy group, a phenoxy group, a hydroxyl group, a dimethylamino group, a morpholino group, a mercapto group, and a phenylthio group.

When $R^4$ represents an amino group, the amino group may be an amino group in which a hydrogen atom is bonded to the nitrogen atom, or may be a substituted amino group in which an alkyl group or an aryl group is bonded to the nitrogen atom. Specific examples of the amino group include an amino group, a dimethylamino group, a diethylamino group, a diphenylamino group, a pyrrolidyl group, a morpholino group, and a piperidyl group.

Among the above, a structure in which both $R^2$ and $R^4$ are morpholino groups is most preferred.

In Formula (1), $R^3$ represents a hydrogen atom or an alkyl group having at least one substituent selected from following Group (A).

Group (A): a cyano group, an alkenyl group, an alkynyl group, —SRa, —CONRaRb, —OC(O)NRaRb, —OC(O)Ra, —C(O)ORa, —S(O)Ra, and —S(O)$_2$Ra, in which Ra and Rb each independently represent a hydrogen atom, an alkyl group, an aryl group, or a heteroaryl group.

$R^3$ is preferably an alkyl group having any one of —SRa, —OC(O)Ra and —C(O)ORa as a substituent, more preferably an alkyl group having —SRa as a substituent. $R^3$ is particularly preferably an alkyl group having —SRa in which Ra is an aryl group, specifically, —SRa in which Ra is a phenyl group, a phenyl group substituted by a halogen atom, or a phenyl group substituted by an alkyl group. In other words, $R^3$ is most preferably an alkyl group having, as a substituent, —SRa in which Ra represents an aryl group which may have a substituent.

Preferable examples of the alkyl group, aryl group, and heteroaryl group represented by Ra or Rb are the same as those described above.

The specific oxime compound represented by Formula (1) is more preferably a compound represented by following Formula (5).

Formula (5)

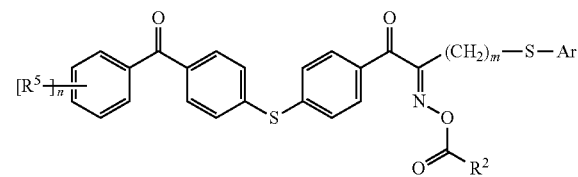

In Formula (5), $R^2$ represents an alkyl group, an aryl group, a heteroaryl group, an alkoxy group, an aryloxy group, or a heteroaryloxy group. $R^5$ represents a halogen atom, an alkyl group, an alkoxy group, or an amino group. Ar represents an aryl group. n represents an integer of 0 to 3. m represents an integer of 1 to 3.

$R^2$ in Formula (5) has the same definitions as $R^2$ in Formula (1), and preferable examples are also the same.

$R^5$ in Formula (5) may be at any position on the aromatic ring. When n represents 2 or 3, two or more of $R^5$ may be the same or different from each other.

$R^5$ in Formula (5) represents a halogen atom, an alkyl group, an alkoxy group, or an amino group. Preferable examples thereof are the same as the examples of the halogen atom, alkyl group, alkoxy group and amino group that have been previously mentioned in connection with Formula (1).

An aryl group represented by Ar is preferably an aromatic ring having 6 to 30 carbon atoms, more preferably an aromatic ring having 6 to 20 carbon atoms, and still more preferably an aromatic ring having 6 to 10 carbon atoms. The aromatic ring is preferably an unsubstituted aromatic ring or an aromatic ring having a halogen atom or an alkyl group as a substituent.

Specific examples of the aryl group represented by Ar include a phenyl group, a p-chlorophenyl group, a p-bromophenyl group, a p-fluorophenyl group, a p-methoxyphenyl group, a p-tolyl group, a 2,6-dimethylphenyl group, and a 2-naphthalenyl group. The aryl group represented by Ar is more preferably a p-chlorophenyl group, a p-bromophenyl group, a 2,6-dimethylphenyl group, and a 2-naphthalenyl group, and still more preferably a p-chlorophenyl group.

n represents an integer of 0 to 3, more preferably 0 to 2, and most preferably 0.

m represents an integer of 1 to 3, more preferably 2 to 3, and most preferably 2.

The synthesis scheme of the photopolymerization initiator represented by Formula (1) is typically represented by the following formula.

More specifically, an oxime compound can be obtained by allowing a ketone compound having a methylene portion at an α position to react with a nitrite in the presence of a base. Then, an oxime ester compound represented by Formula (1) can be obtained by allowing the oxime compound to react with carboxylic acid chloride in the presence of a base. In the following synthesis scheme, X and $R^1$ to $R^3$ have the same definitions as those in Formula (1), respectively.

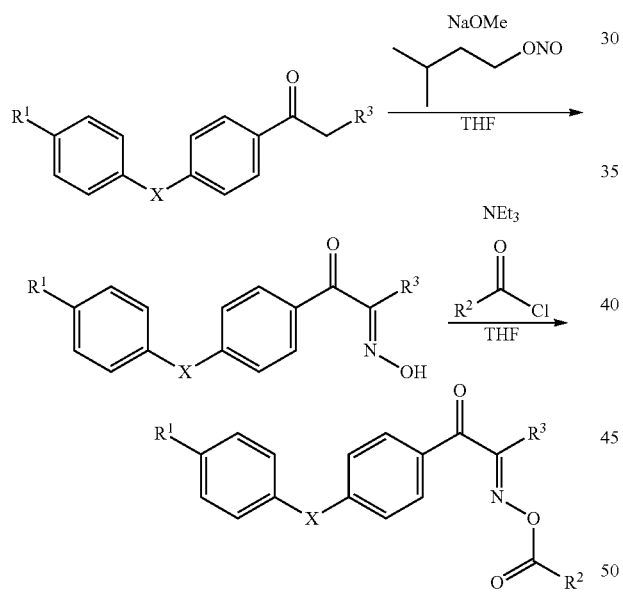

The following are specific examples of the oxime compound according to the invention (Exemplary Compounds (A-1) to (A-24)). However, the invention is not limited to these examples.

(A-1)

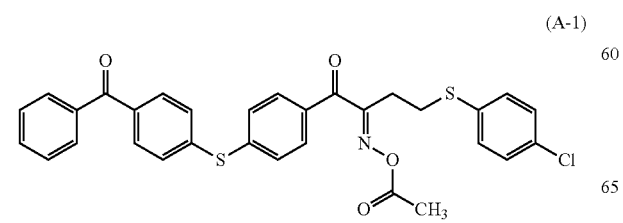

(A-2)

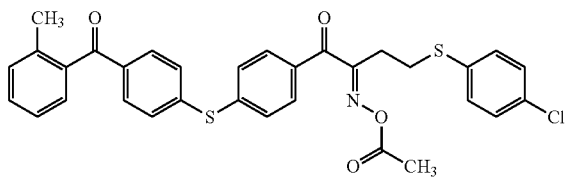

(A-3)

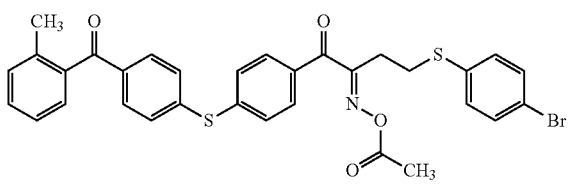

(A-4)

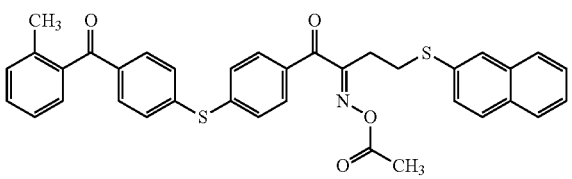

(A-5)

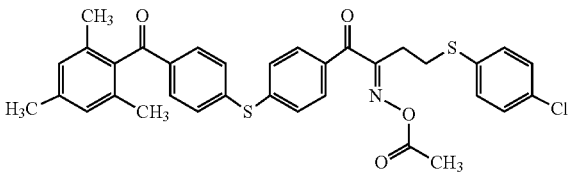

(A-6)

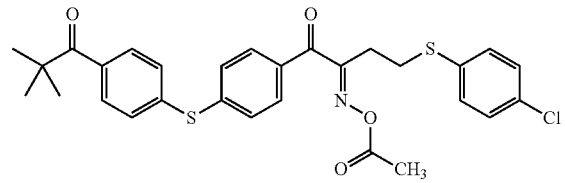

(A-7)

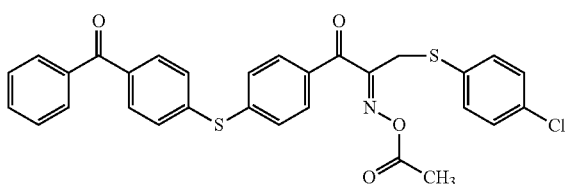

(A-8)

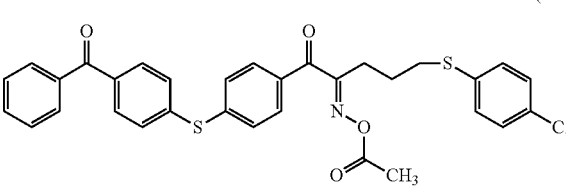

(A-9) 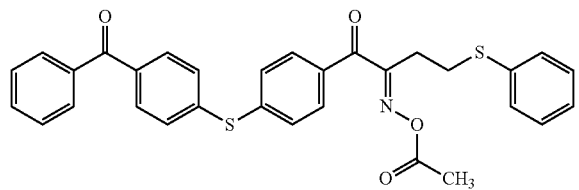
(A-10) 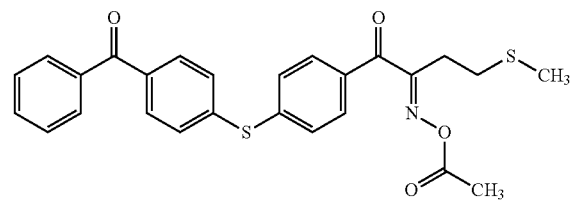
(A-11) 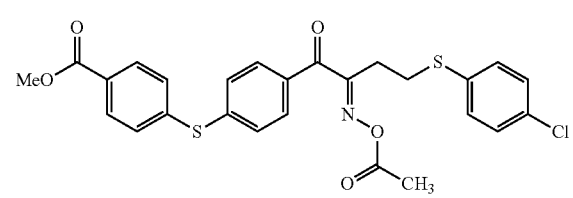
(A-12) 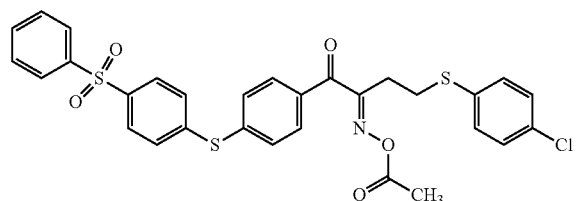
(A-13) 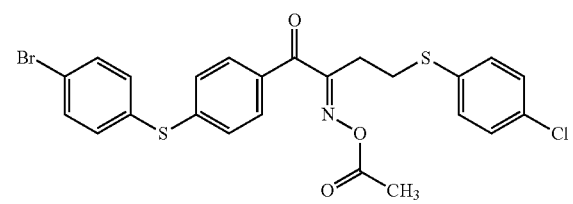
(A-14) 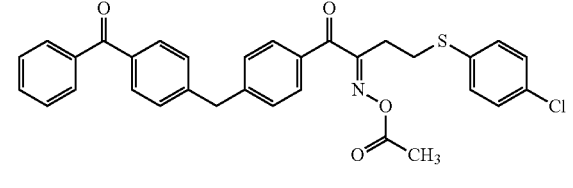
(A-15)
(A-16) 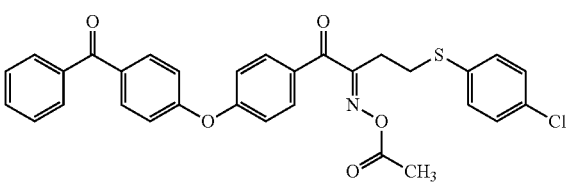
(A-17) 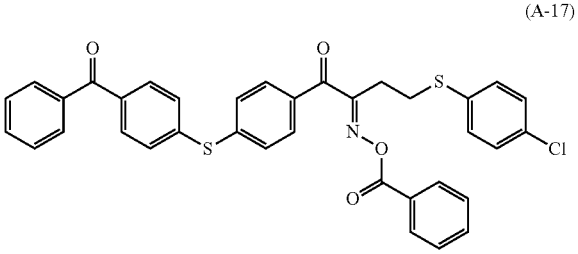
(A-18) 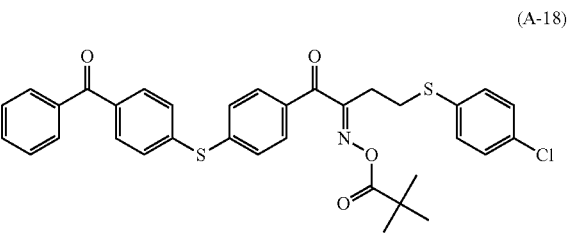
(A-19) 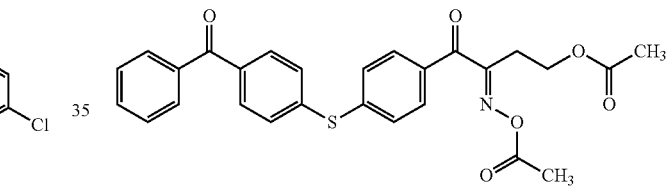
(A-20) 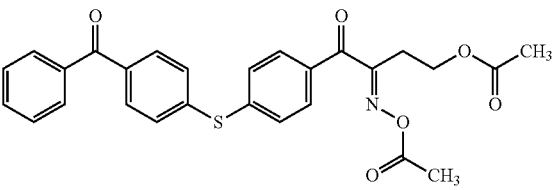
(A-21) 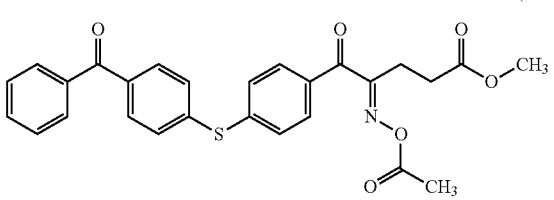
(A-22) 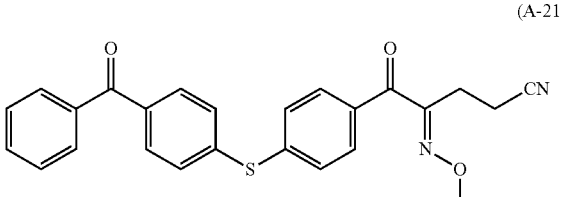

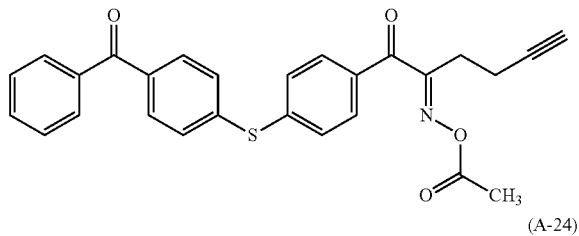
(A-23)

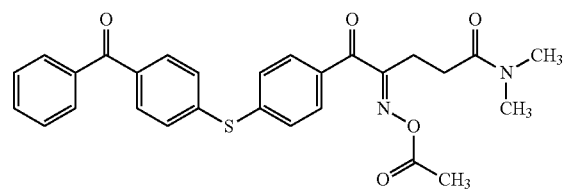
(A-24)

Among the above specific examples, Exemplary Compounds (A-1) to (A-5), (A-17) and (A-18) are preferred.

The (A) specific oxime compound may be used alone or in combination of two or more kinds. The content of the (A) specific oxime compound in the polymerizable composition of the invention may be selected as appropriate according to purposes, but is generally preferably from 1% by mass to 20% by mass, more preferably from 3% by mass to 15% by mass with respect to the solid content of the composition. When the polymerizable composition of the invention is used for forming a colored region of a color filter, the content of the (A) specific oxime compound in the polymerizable composition is preferably from 7% by mass to 15% by mass, and when the polymerizable composition of the invention is used for forming a color filter of a solid-state image sensor, the content of the (A) specific oxime compound in the polymerizable composition is preferably from 3% by mass to 20% by mass.

<(B) Polymerizable Compound>

The polymerizable compound that can be used for the polymerizable composition of the invention is an addition polymerizable compound having at least one ethylenically unsaturated double bond, and is selected from compounds having at least one, preferably two or more, terminal ethylenically unsaturated bonds. Such compounds are widely known in the industrial field and can be used in the invention without particular limitation. These compounds have a chemical form of a monomer, a prepolymer, i.e., a dimer, a trimer and an oligomer, or a mixture and a copolymer thereof, for example.

Further suitable examples include compounds obtained by addition reaction of an unsaturated carboxylic ester or amide having a nucleophilic substituent, such as a hydroxyl group, an amino group or a mercapto group, with a monofunctional or polyfunctional isocyanate or epoxy; and compounds obtained by dehydration condensation reaction of an unsaturated carboxylic ester or amide with a monofunctional or polyfunctional carboxylic acid.

Also preferred are compounds obtained by addition reaction of an unsaturated carboxylic ester or amide having an electrophilic substituent, such as an isocyanate group or an epoxy group, with a monofunctional or polyfunctional alcohol, amine or thiol; and compounds obtained by substitution reaction of an unsaturated carboxylic ester or amide having a leaving substituent, such as a halogen group or a tosyloxy group, with a monofunctional or polyfunctional alcohol, amine or thiol.

It is also possible to use compounds obtained through the above reactions but the unsaturated carboxylic acid is changed to an unsaturated phosphonic acid, styrene, vinyl ether, or the like.

Preferable examples of the (B) polymerizable compound suitably used in the invention include compounds described in Paragraphs [0056] to [0078] of JP-A No. 2008-224982. Among these, the following compounds are preferable.

Specific examples of a monomer as an ester of an aliphatic polyhydric alcohol and an unsaturated carboxylic acid include acrylic cid esters, such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and isocyanuric acid EO-modified triacrylate.

Examples of methacrylic acid esters include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2 hydroxypropoxy)phenyl]dimethyl methane, and bis-[p-(methacryloxyethoxy)phenyl]dimethyl methane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of crotonic acid esters include ethylene glycol dicrotonate, tetramethylene glycol dicrotonate, pentaerythritol dicrotonate, and sorbitol tetradicrotonate. Examples of isocrotonic acid esters include ethylene glycol diisocrotonate, pentaerythritol diisocrotonate, and sorbitol tetraisocrotonate. Examples of maleic acid esters include ethylene glycol dimaleate, triethylene glycol dimaleate, pentaerythritol dimaleate, and sorbitol tetramaleate.

Examples of esters of an aromatic polyhydroxy compound and an unsaturated carboxylic acid include hydroquinone diacrylate, hydroquinone dimethacrylate, resorcin diacrylate, resorcin dimethacrylate, and pyrogallol triacrylate.

The ester obtained by esterification reaction of an unsaturated carboxylic acid with a polyvalent carboxylic acid and a polyvalent hydroxy compound is not necessarily a single substance and may be a mixture. Typical examples include a condensate of acrylic acid, phthalic acid or ethylene glycol, a condensate of acrylic acid, maleic acid or diethylene glycol, a condensate of methacrylic acid, terephthalic acid or pentaerythritol, and a condensate of acrylic acid, adipic acid, butanediol or glycerin.

Preferable examples of other esters include aliphatic alcohol-based esters described in JP-B No. 51-47334 and JP-A No. 57-196231, esters each having an aromatic skeleton described in JP-A Nos. 59-5240, 59-5241 and 2-226149, and esters each having an amino group described in JP-A No. 1-165613. These ester monomers described above can be used also as a mixture.

Specific examples of a monomer of amide of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bisacrylamide, and xylylene bis-methacrylamide. Preferable examples of other amide type monomers include those each having a cyclohexylene structure described in JP-B No. 54-21726.

A urethane addition polymerizable compound produced using an addition reaction of an isocyanate and a hydroxyl group is also preferable. Specific examples thereof include a vinyl urethane compound described in JP-B No. 48-41708 having two or more polymerizable vinyl groups per molecule, which is obtained by adding a vinyl monomer having a hydroxyl group, represented by Formula (A) as described below, to a polyisocyanate compound having two or more isocyanate groups per molecule.

$$CH^2=C(R^4)COOCH_2CH(R^5)OH \qquad \text{Formula (A)}$$

(in Formula (A), $R^4$ and $R^5$ each independently represent H or $CH_3$.)

Details of the addition polymerizable compound, such as the structure, whether or not the compound should be used alone or in combination of two or more kinds, or the amount of the compound to be added, can be arbitrarily determined in accordance with the desired performances of the finally obtained addition polymerizable compound. For example, the addition polymerizable compound can be selected from the following viewpoints.

In view of the sensitivity, the addition polymerizable compound containing more unsaturated groups per molecule is more preferred, and typically the addition-polymerizable compound preferably has two or more functional groups. In order to increase the strength of a cured film, the addition-polymerizable compound preferably has three or more functional groups. It is also effective to control both the sensitivity and the strength by using a compound having different functionalities or different polymerizable groups (e.g. acrylates, methacrylates, styrene compounds, and vinyl ether compounds) in combination with the addition-polymerizable compound.

Selection of the addition polymerizable compound and the method of using the same are important factors also with respect to dispersibility and compatibility with other components (e.g. a photopolymerization initiator, a colorant (pigment or dye), and a binder polymer) to be contained in the addition polymerizable composition. The compatibility of the addition polymerizable compound may be improved by using, for example, an addition polymerizable compound with low purity or a combination of two or more addition polymerizable compounds, or alternatively, selecting a particular structure. It is also possible to select an addition polymerizable compound having a particular structure for the purpose of improving it adhesion properties with respect to a hard surface of a support or the like.

The content of the (B) polymerizable compound in the polymerizable composition is preferably from 0.1 to 30% by mass, more preferably from 0.2 to 20% by mass, and still more preferably from 0.3 to 15% by mass, with respect to the total solid content of the composition.

The polymerizable compound may be used alone or in a combination of two or more kinds thereof.

<(C) Colorant>

The polymerizable composition of the invention contains a (C) colorant. By including a colorant, a colored polymerizable composition having a desired color hue can be obtained.

Since the polymerizable composition includes a specific oxime compound, which is a (A) polymerization initiator of the invention having a superior sensitivity with respect to light having a short wavelength, i.e., 365 nm, it can cure at high sensitivity even if a colorant is included at high concentration.

The colorant to be used in the polymerizable composition is not particularly limited, and various known dyes or pigments can be used alone or as a mixture of two or more kinds thereof. The colorant are suitably selected according to the intended use of the polymerizable composition. When the polymerizable composition of the invention is used for manufacturing a color filter, either a colorant having a chromatic color such as R, G or B, which is used for forming color pixels of a color filter (chromatic color colorant), or a colorant having a black color, which is generally used for forming a black matrix (black colorant), can be used.

Since the polymerizable composition of the invention including the (A) specific oxime compound can cure at high sensitivity even with a small exposure amount, it is particularly preferably used as a polymerizable composition containing a black colorant that is hard to transmit light.

Hereinafter, the colorant applicable to the polymerizable composition will be described in detail, by referring to the colorants suitable for a color filter.

—(C-1) Pigment—

Examples of chromatic color pigments include various kinds of known inorganic or organic pigments. Considering the fact that it is preferable that the polymerizable composition has a high transmittance with respect to exposure light whether or not the pigment is inorganic or organic, the particle diameter of the pigment is preferably as small as possible, and in view of handleability, the average particle diameter of the pigment is preferably from 0.01 μm to 0.1 μm, and more preferably from 0.01 μm to 0.05 μm.

Examples of the inorganic pigments include metallic compounds such as metal oxides, metal complex salts and the like, and specific examples include oxides of metals, such as iron, cobalt, aluminum, cadmium, lead, copper, titanium, magnesium, chromium, zinc and antimony, and complex oxides of these metals.

Examples of the organic pigments include those described in paragraphs [0030] to and paragraphs [0039] to [0048] of JP-A No. 2008-224982; and organic pigments formed by changing Cl in the structure of C. I. Pigment Green 58 and C.I. Pigment Blue 79 to OH.

In particular, in the invention, pigments having a basic nitrogen atom in the structure thereof are preferably used. These pigments having a basic nitrogen atom demonstrate favorable dispersibility in a polymerizable composition. The reason for this has not been sufficiently elucidated, but is presumed to be favorable affinity achieved between a photosensitive polymerization component and the pigment.

These organic pigments can be used alone or as a combination in various ways, in order to increase the color purity.

Specific examples of the type and the combination of the pigments include the use of a red pigment such as an anthraquinone pigment, a perylene pigment, or a diketopyrrolopyrrole pigment, and combinations of at least one of these red pigments with a yellow pigment such as a disazo yellow pigment, an isoindoline yellow pigment or a quinophthalone yellow pigment, or with a perylene red pigment.

Examples of the anthraquinone pigment include C.I. Pigment Red 177. Examples of the perylene pigment include C.I. Pigment Red 155 and C.I. Pigment Red 224. Examples of the diketopyrrolopyrrole pigment include C.I. Pigment Red 254.

From the viewpoint of color reproducibility, these red pigments are preferably used in combination with C.I. Pigment Yellow 139.

The mass ratio of the red pigment to the yellow pigment (red pigment:yellow pigment) is preferably from 100:5 to 100:50. When the mass ratio is within this range, it is advantageous in terms of improving the color purity and adjusting the color hue to conform to the NST target.

The mass ratio is particularly preferably within the range of from 100:10 to 100:30. When two or more kinds of red pigments are used in combination, the mass ratio of the pigments can be adjusted in accordance with the chromaticity thereof.

As a green pigment, a halogenated phthalocyanine pigment can be used alone or in combination with a disazo yellow pigment, a quinophthalone yellow pigment, an azomethine yellow pigment, or an isoindoline yellow pigment.

Preferable examples of such combinations include a combination of C.I. Pigment Green 7, 36 or 37 with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185. The mass ratio of the green pigment to the yellow pigment (green pigment:yellow pigment) is preferably from 100:5 to 100:150. When the mass ratio is within this range, it is advantageous in terms of improving the color purity and adjusting the color hue to conform to the NST target.

The mass ratio is particularly preferably in the range of from 100:30 to 100:120.

As a green pigment, a halogenated phthalocyanine pigment containing zinc is preferably used. Examples of such a pigment include C.I. Pigment Green 58.

As a blue pigment, a phthalocyanine pigment can be used alone or in combination with a dioxazine purple pigment.

Preferable examples of the blue pigment include a mixture of C.I. Pigment Blue 15:6 with C.I. Pigment Violet 23. The mass ratio of the blue pigment to the purple pigment (blue pigment:purple pigment) is preferably from 100:0 to 100:30, more preferably from 100:0 to 100:10.

Among these pigments, a pigment containing zinc is particularly preferred, since the pigment improves the transmittance in a desired absorption band, and enables spectrum design that achieves excellent color separation.

—(C-2) Light Blocking Pigment—

Examples of light blocking pigments, which are suitably used when the polymerizable composition of the invention is used for the formation of a black matrix of a color filter, include carbon black, titanium black, iron oxide, and titanium oxide. These pigments are used alone or as a mixture of two or more kinds. Among these pigments, titanium black is particularly preferred as a light blocking pigment.

In the following, titanium black, which is a suitable pigment as a light blocking pigment, and a titanium black dispersion, which is a suitable way of using titanium black, will be explained.

The titanium black dispersion refers to a dispersion containing titanium black as a colorant.

When titanium black is used in the polymerizable composition in the form of a previously prepared titanium black dispersion, dispersibility and dispersion stability of the titanium black can be improved.

Hereinafter, titanium black will be described.

The titanium black usable in the invention refers to black particles including a titanium atom. Preferable examples thereof include lower titanium oxide and titanium oxynitride. Titanium black particles can be surface-modified for the purpose of improving dispersibility, suppressing aggregation properties, or the like, as necessary. Titanium black particles can be coated with silicon oxide, titanium oxide, germanium oxide, aluminum oxide, magnesium oxide, or zirconium oxide; or can be treated with a water-repellent substance, such as those described in JP-A No. 2007-302836.

Examples of the method for producing titanium black include a method including heating and reducing a mixture of titanium dioxide and metal titanium under a reductive atmosphere (see JP-A No. 49-5432); a method including reducing ultrafine titanium dioxide obtained by subjecting tetrachloride titanium to high-temperature hydrolysis under a reductive atmosphere containing hydrogen (see JP-A No. 57-205322); a method including reducing titanium dioxide or titanium hydroxide at high temperature in the presence of ammonia (see JP-A Nos. 60-65069 and 61-201610); and a method including attaching a vanadium compound to titanium dioxide or titanium hydroxide, and reducing the same at high temperature in the presence of ammonia (see JP-A No. 61-201610). However, the method for producing titanium black is not limited to the above.

The particle diameter of titanium black particles is not particularly limited, but is preferably from 3 to 2000 nm, more preferably from 10 to 500 nm, and still more preferably from 20 to 200 nm, from the viewpoint of dispersibility and colorability.

The specific surface area of titanium black is not particularly limited, but the value measured by a BET method is usually from about 5 to 150 $m^2/g$, and particularly preferably from about 20 to 100 $m^2/g$, in order to achieve desired water repellency of the titanium black after being surface-treated with a water-repellent agent.

Examples of commercially available products of titanium black include TITANIUM BLACK 10S, 12S, 13R, 13M, 13M-C, 13R and 13R-N (trade name, manufactured by MITSUBISHI MATERIALS CORP.) and TILACK (trade name, manufactured by Ako Kasei Co., Ltd.), but the invention is not limited to these products.

—(C-3) Dye—

When the colorant used in the polymerizable composition is a dye, a colored composition in which the colorant is uniformly dispersed can be obtained.

The dye that can be used as the colorant in the polymerizable composition is not particularly limited, and known dyes used for color filters can be used.

In terms of chemical structure, exemplary dyes that can be used include pyrazole azo dyes, anilino azo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azo methine dyes, xanthene dyes, phthalocyanine dyes, benzopyran dyes and indigo dyes.

Among these dyes, dyes containing zinc are preferable and examples thereof include zinc pyrromethene dyes described in JP-A No. 2008-83416, U.S. Patent Application Publication No. 2008/0776044, and JP-A No. 2010-184009.

Preferable examples of zinc pyrromethene dyes include at least one selected from a dipyrromethene zinc complex compound obtained by using a fluorine-containing dipyrromethene compound represented by following Formula (PM-1) and zinc or a zinc compound, and a tautomer thereof.

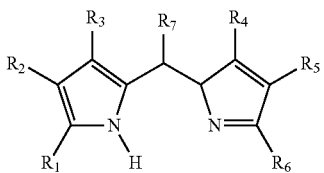

Formula (PM-1)

In Formula (PM-1) above, $R_1$, $R_2$, $R_3$, $R_4$, $R_5$, $R_6$ and $R_7$ each independently represent a hydrogen atom or a substituent, and at least one of $R_1$ to $R_7$ represents a substituent represented by following Formula (PM-2) by way of substituting at least one hydrogen atom. In Formula (PM-2), a represents an integer of 1 or greater. Each of $R_f$ independently represents a fluorine atom, a fluorine-containing alkyl group having 1 to 4 carbon atoms, a fluorine-containing aryl group, a fluorine-containing alkoxy group having 1 to 4 carbon atoms, a fluorine-containing alkyl sulfonamide group having 1 to 4 carbon atoms, or a fluorine-containing aryl sulfonamide group; m represents an integer of 1 to 5; each of $R_g$ independently represents a hydrogen atom or a substituent; and n represents an integer of 0 to 4. L represents a single bond, an oxygen atom, a sulfur atom, —NH—, —R—NH— (R represents an alkylene group), —Ar—NH— (Ar represents an arylene group), a carbonyl group, an ester group, an oxycarbonyl group, a thioester group, a thiocarbonyl group, *—CONH—, *—NHCO—, *—NHSO$_2$—, a sulfinyl group, a sulfonyl group, *—SO$_2$NH—, an alkylene chain having 1 to 4 carbon atoms, or an arylene group. * represents a site to be bonded to Formula (PM-1).

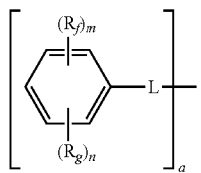

Formula (PM-2)

The novel dipyrromethene zinc complex compound as shown above exhibits favorable solvent solubility and fastness, and a high absorption coefficient. By using a dipyrromethene zinc complex compound or a tautomer thereof, a solution having a higher concentration than that of a solution prepared by using conventional dipyrromethene compounds (e.g., 35% by mass or more) can be prepared.

Preferable examples of pyrromethene dyes that are useful in the invention include specific metal complex compounds in which a metal represented by Ma is zinc, which are described in paragraphs [0103] to [0121] of JP-A No. 2010-184009, and these compounds are suitably used for the invention.

A zinc complex compound obtained from a fluorine-containing dipyrromethene compound represented by Formula (PM-1) can be synthesized by, for example, methods described in U.S. Pat. Nos. 4,774,339 and 5,433,896, JP-A Nos. 2001-240761 and 2002-155052, Japanese Patent No. 3614586, Aust. J. Chem, 1965, 11, pp. 1835-1845, and J. H. Boger et al, Heteroatom Chemistry, Vol. 1, No. 5, 389 (1990).

The zinc pyrromethene dye may be in the form of a polymer for the purpose of increasing light fastness or the like, and examples thereof are described in Japanese Patent Application No. 2009-269088, which compounds have been previously proposed by the present applicant. Examples of the zinc pyrromethene dye in the form of a polymer include a compound including a colorant monomer represented by following Formula (PP-1) as a polymerization component, which compound is a colorant polymer in which a metal represented by Ma is zinc.

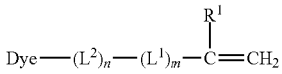

Formula (PP-1)

In Formula (PP-1), $R^1$ represents a hydrogen atom, a halogen atom, an alkyl group, or an aryl group. $L^1$ represents —N(R$^2$)C(=O)—, —OC(=O)—, —C(=O)N(R$^2$)—, —C(=O)O—, a group represented by following Formula (PP-2), a group represented by following Formula (PP-3), or a group represented by following Formula (PP-4). $L^2$ represents a divalent linking group. m and n each independently represent 0 or 1. Dye represents a colorant residue formed by removing one hydrogen atom from a dipyrromethene metal complex compound represented by following Formula (PP-5), or a colorant residue formed by removing one hydrogen atom from any one of $R^{11}$ to $R^{17}$, $X^1$, $Y^1$ or $Y^2$ of a dipyrromethene metal complex compound represented by following Formula (PP-6). $R^2$ represents a hydrogen atom, an alkyl group, an aryl group, or a heterocyclic group.

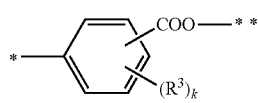

Formula (PP-2)

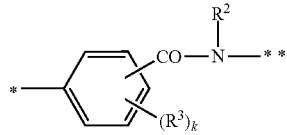

Formula (PP-3)

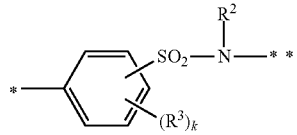

Formula (PP-4)

$R^2$ represents a hydrogen atom, an alkyl group, an aryl group, or a heterocyclic group. $R^3$ represents a hydrogen atom or a substituent. k represents an integer of 0 to 4. In Formulae (PP-2) to (PP-4), * represents a site to be bonded to —C(R$^1$)=CH$_2$ in Formula (PP-1), and ** represents a site to be bonded to $L^2$ or Dye (when n=0) in Formula (PP-1).

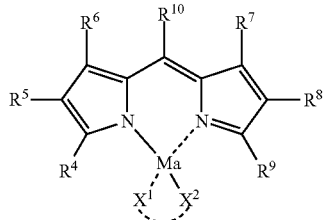

Formula (PP-5)

In Formula (PP-5), $R^4$ to $R^9$ each independently represent a hydrogen atom or a substituent, and $R^{10}$ represents a hydrogen atom, a halogen atom, an alkyl group, an aryl group, or a heterocyclic group. Ma represents a metal atom or a metallic compound. $X^1$ represents a group capable of being bonded to Ma, $X^2$ represents a group that neutralizes the charge of Ma, and $X^1$ and $X^2$ may be bonded to each other to form a 5-membered, 6-membered, or 7-membered ring with Ma.

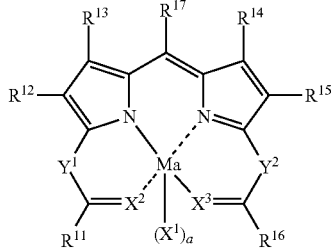

Formula (PP-6)

In Formula (PP-6), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group. $R^{12}$ to $R^{15}$ each independently represent a hydrogen atom or a substituent. $R^{17}$ represents a hydrogen atom, a halogen atom, an alkyl group, an aryl group, or a heterocyclic group. Ma represents a metal atom or a metallic compound. $X^2$ and $X^3$ each independently represent NR (R represents a hydrogen atom, an alkyl group, an alkenyl group, an aryl group, a heterocyclic group, an acyl group, an alkyl sulfonyl group, or an aryl sulfonyl group), a nitrogen atom, an oxygen atom, or a sulfur atom. $Y^1$ and $Y^2$ each independently represent NR (R represents a hydrogen atom, an alkyl group, an alkenyl group, an aryl group, a heterocyclic group, an acyl group, an alkyl sulfonyl group, or an aryl sulfonyl group), a nitrogen atom, or a carbon atom. $R^{11}$ and $Y^1$ may be bonded to each other to form a 5-membered, 6-membered or 7-membered ring, and $R^{16}$ and $Y^2$ may be bonded to each other to form a 5-membered, 6-membered or 7-membered ring. $X^1$ represents a group capable of being bonded to Ma, and a represents 0, 1 or 2.

The dipyrromethene metal complex compound represented by Formulae (PP-5) or (PP-6) can be synthesized by methods described in, for example, U.S. Pat. Nos. 4,774,339 and 5,433,896, JP-A Nos. 2001-240761 and 2002-155052, Japanese Patent No. 3614586, Aust. J. Chem, 1965, 11, pp. 1835-1845, and J. H. Boger et al, Heteroatom Chemistry, Vol. 1, No. 5, 389 (1990). Specifically, the dipyrromethene metal complex compound may be synthesized by a method described in paragraphs [0131] to [0157] of JP-A No. 2008-292970.

Examples of the colorant polymer that includes a colorant monomer represented by Formula (PP-1) as a polymerization component include polymerized zinc pyrromethene dyes containing a colorant monomer described in paragraphs [0122] to [0127] of JP-A No. 2009-269088, as a polymerization component. More specific examples include polymerized zinc pyrromethene dyes described in paragraphs [0146] to [0165] of JP-A No. 2009-269088. These dyes are suitably used in the invention.

The use of a dye containing zinc is preferred since it enables improvement in transmissivity in a desired absorption band, even when a dye is used as a colorant, thereby making it possible to achieve spectrum design with excellent color separation.

When a pigment or a dye containing zinc is used as a (C) colorant together with a (A) specific oxime compound, light absorption of the specific oxime compound cab be optimized and transmissivity due to the colorant can be further improved, thereby providing a further advantage of sufficient intra-film curability.

The content of the (C) colorant in the polymerizable composition is preferably from 30% by mass to 95% by mass, more preferably from 40% by mass to 90% by mass, and still more preferably from 50% by mass to 80% by mass, with respect to the total solid content of the polymerizable composition.

By adjusting the content of the colorant to be within the above range, an appropriate chromaticity can be obtained when a color filter is produced using the polymerizable composition. Moreover, the polymerization composition can be sufficiently cured by light and strength of a film can be maintained. As a result, narrowing of the development latitude during alkali development can be suppressed.

<(D) Pigment Dispersant>

When the polymerizable composition contains, as a (C) colorant, a (C-1) light blocking pigment such as titanium black or a (C-1) pigment such as an organic pigment it is preferable to further add a (D) pigment dispersant from the viewpoint of increasing the dispersibility of the pigment.

Examples of the pigment dispersant that can be used in the invention include polymer dispersants (e.g., polyamide amine and a salt thereof, polycarboxylic acid and a salt thereof, high-molecular-weight unsaturated acid ester, modified polyurethane, modified polyester, modified poly(meth) acrylate, a (meth)acrylic copolymer, and a naphthalene sulfonic acid formalin condensate), polyoxyethylene alkyl phosphoric acid ester, polyoxyethylene alkylamine, alkanolamine, and a pigment derivative.

The polymer dispersants can be further classified into a straight-chain polymer, a terminal-modified polymer, a graft polymer, and a block polymer, from the viewpoint of its structure.

A polymer dispersant functions to prevent re-aggregation of a pigment by adsorbing to a surface of the pigment. Therefore, a terminal-modified polymer, a graft polymer and a block polymer, having an anchor site with respect to the pigment surface, can be mentioned as preferable structures of the polymer dispersant.

On the other hand, a pigment derivative exhibits an effect of promoting adsorption of a polymer dispersant by modifying a surface of the pigment.

The pigment dispersant that can be used in the invention is available also as commercial products, and specific examples thereof include DISPERBYK-101 (polyamidoamine phosphoric acid salt), 107 (carboxylic acid ester), 110 (copolymer containing an acid group), 130 (polyamide), 161, 162, 163, 164, 165, 166, 170 (high-molecular-weight copolymers) and BYK-P104 and P105 (high-molecular-weight unsaturated polycarboxylic acid) manufactured by BYK Chemie Corp.; EFKA4047, 4050 to 4010 to 4165 (polyurethanes), EFKA 4330 to 4340 (block copolymers), 4400 to 4402 (modified polyacrylate), 5010 (polyester amide), 5765 (high-molecular-weight polycarboxylic acid salt), 6220 (fatty acid polyester), 6745 (phthalocyanine derivative) and 6750 (azo pigment derivative), manufactured by EFKA Additives, Inc.; AJISPER-PB821 and PB822 manufactured by Ajinomoto Fine Techno Co., Inc.; FLOWLEN TG-710 (urethane oligomer), and POLYFLOW No. 50E and No. 300 (acrylic copolymers) manufactured by Kyoeisha Chemical Co., Ltd., DISPERON KS-860, 873SN, 874, #2150 (aliphatic polyvalent carboxylic acids), #7004 (polyether ester), DA-703-50, DA-705, and DA-725 manufactured by Kusumoto Chemicals, Ltd., DEMOL RN, N (naphthalenesulfonic acid-formalin polycondensate), MS, C and SN-B (aromatic sulfonic acid-formalin polycondensate), HOMOGENOL L-18 (high-molecular-weight polycarboxylic acid), EMARGEN 920, 930, 935 and 985 (polyoxyethylene nonylphenyl ether), and ACETAMINE 86 (stearylamine acetate) manufactured by Kao Corp.; SOLSPERSE 5000 (phthalocyanine derivative), 22000 (azo pigment derivative), 13240 (polyesteramine), 3000, 17000, 27000 (polymer having a functional moiety at the end), 24000, 28000, 32000, and 38500 (graft type polymers) manufactured by Lubrizol Corp.; and NIKKOL T106 (polyoxyethylene sorbitan monooleate) and MYS-IEX (polyoxyethylene monostearate) manufactured by Nikko Chemical Co., Ltd.

These pigment dispersants may be used alone or in combination of two or more kinds thereof. In the invention, it is preferable to use, in particular, a pigment derivative and a polymer dispersant in combination.

The content of the (D) pigment dispersant in the polymerizable composition is preferably 1 to 80 parts by mass, more preferably 5 to 70 parts by mass, and still more preferably 10 to 60 parts by mass, based on 100 parts by mass of the pigment as the (C) colorant.

Specifically, when the polymer dispersant is used, the amount thereof is preferably in the range of from 5 to 100 parts by mass and more preferably in the range of from 10 to 80 parts by mass, with respect to 100 parts by mass of the pigment.

When a pigment derivative is used in combination, the amount of the pigment derivative is preferably in the range of from 1 to 30 parts by mass, more preferably in the range of from 3 to 20 parts by mass, and particularly preferably in the range of from 5 to 15 parts by mass, with respect to 100 parts by mass of the pigment.

When a pigment is used as a (C) colorant and a (D) pigment dispersant is used in the polymerizable composition, the total content of the colorant and the dispersant is preferably from 30 to 90% by mass, more preferably from 40 to 85% by mass, and still more preferably from 50 to 80% by mass, with respect to the total solid content in the polymerizable composition, from the viewpoint of curing sensitivity and color density.

<Other Ingredients>

The polymerizable composition may further contain other ingredients as described below as required, insofar as the effects of the invention are not impaired.

Hereinafter, the other ingredients that may be included in the polymerizable composition will be described.

<(E) Sensitizer>

The polymerizable composition may contain a sensitizer for the purpose of enhancing the radical generation efficiency of a radical initiator and extending the wavelength of light to which the polymerizable composition is sensitive.

The sensitizer that can be used in the invention is preferably one capable of sensitizing a (A) radical photopolymerization initiator by way of an electron transfer mechanism or an energy transfer mechanism.

Examples of the sensitizers for use in the polymerizable composition include compounds described in paragraphs [0101] to [0154] of JP-A No. 2008-32803.

The content of the sensitizer in the polymerizable composition is preferably from 0.1% by mass to 20% by mass, and more preferably from 0.5% by mass to 15% by mass in terms of solid content, from the viewpoint of optical absorption efficiency and initiation decomposition efficiency at deep portions.

The sensitizers may be used alone or in combination of two or more kinds thereof.

<(F) Co-Sensitizer>

It is also preferable to include a co-sensitizer in the polymerizable composition.

In the invention, the co-sensitizer has effects of further enhancing the sensitivity of a (A) radical photopolymerization initiator or a sensitizer as mentioned above with respect to active radiation, and suppressing inhibition due to oxygen of polymerization of a (B) polymerizable compound.

Examples of the co-sensitizer include compounds described in paragraphs [0176] to [0178] of JP-A No. 2008-32803.

The content of the co-sensitizer is preferably in the range of from 0.1 to 30% by mass, more preferably in the range of from 1 to 25% by mass, and still more preferably in the range of from 0.5 to 20% by mass, with respect to the total solid content of the polymerizable composition, from the viewpoint of enhancing the curing speed that is attributed to the balance between the polymer growth rate and the chain transfer.

<(G) Binder Polymer>

The polymerizable composition may include a binder polymer for the purpose of improving the coating properties or the like, as required. As the binder polymer, it is preferable to use a linear organic polymer, and any known linear organic polymer may be used as appropriate. In order to enable development with water or development with weak alkaline water, a linear organic polymer that is soluble or swellable with respect to water or weak alkaline water is suitably selected. The linear organic polymer is selected and used not only in view of using the same as a film-forming agent, but also in view of its applicability to a water developer, a weak alkaline water developer or an organic solvent developer. For example, when a water-soluble organic polymer is used, development with water can be performed.

Examples of such a linear organic polymer include compounds described in Paragraphs [0166] to [0175] of JP-A No. 2008-32803, and the compounds can be applied to the invention.

Further examples of the binder polymer include acidic cellulose derivatives having a carboxylic acid group in the side chain, and compounds prepared by adding a cyclic acid anhydride to a polymer having a hydroxyl group or the like are also useful.

The weight average molecular weight of the binder polymer usable in the polymerizable composition is preferably in range of 5,000 or larger and more preferably from 10,000 to 300,000, and the number average molecular weight is preferably 1,000 or larger and more preferably in the range of from 2,000 to 250,000. The polydispersity (weight average molecular weight/number average molecular weight) is preferably 1 or more, and more preferably in the range of from 1.1 to 10.

From the viewpoint of pattern formation properties, binder polymers having an acid value of from 50 mgKOH/g to 150 mgKOH/g is preferable. Such binder polymers may be any of a random polymer, a block polymer, a graft polymer, or the like.

The content of the binder polymer is preferably from 1 to 50% by mass, more preferably from 1 to 30% by mass, and still more preferably from 1 to 20% by mass, with respect to the total solid content of the polymerizable composition.

<(H) Polymerization Inhibitor>

In order to prevent unnecessary thermal polymerization of a (B) polymerizable compound that occurs while producing or storing the polymerizable composition, a small amount of thermal polymerization inhibitor is preferably added to the polymerizable composition.

Examples of the thermal polymerization inhibitor that can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (I) salt.

The addition amount of the thermal polymerization inhibitor is preferably from about 0.01% by mass to about 5% by mass, with respect to the total solid content of the polymerizable composition.

Further, if necessary, a higher fatty acid derivative, such as behenic acid or behenic acid amide, may be added such that the higher fatty acid derivative exists locally on the surface of a coating during drying the coating, in order to prevent polymerization inhibition caused by oxygen. The addition amount of the higher fatty acid derivative is preferably from about 0.5% by mass to about 10% by mass, with respect to the total mass of the polymerizable composition.

<(I) Adhesion Enhancer>

In order to increase the adhesion of the cured film with respect to a hard surface of a support or the like, an adhesion enhancer may be added to the polymerizable composition. Examples of the adhesion enhancer include a silane coupling agent and a titanium coupling agent.

Examples of the silane coupling agent include compounds described in paragraph [0185] of JP-A No. 2008-32803.

Among these compounds, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane and phenyltrimethoxysilane are preferable, and γ-methacryloxypropyltrimethoxysilane is most preferable.

The amount of the adhesion enhancer is preferably from 0.5% by mass to 30% by mass, and more preferably from 0.7% by mass to 20% by mass, with respect to the total solid content of the polymerizable composition.

<(J) Diluent>

The polymerizable composition may contain various kinds of organic solvent as a diluent.

Examples of the organic solvent used in the invention include the solvents described in paragraph [0187] of JP-A No. 2008-32803.

The organic solvent as a diluent (solvent) may be used alone or as a mixture of two or more kinds thereof.

The solid content concentration with respect to the organic solvent in the polymerizable composition is preferably from 2% by mass to 60% by mass.

<(K) Surfactant>

In order to further improve coating suitability, various kinds of surfactant may be added to the polymerizable composition of the invention. Examples of the surfactant that may be used in the invention include fluorosurfactants, nonionic surfactants, cationic surfactants and anionic surfactants.

In particular, by using a fluorosurfactant, liquid properties of the composition when formulated as a coating liquid (in particular, fluidity) can be further increased, and uniformity in coating thickness and liquid-saving properties can be further improved.

More specifically, in the polymerizable composition containing a fluorosurfactant, the surface tension between the coating liquid and a coated surface is lowered and wettability with respect to the coated surface is improved, whereby the coating properties can be improved. As a result, a film having a uniform thickness with suppressed thickness unevenness can be more suitably formed even when a thin film having a thickness of several micrometers is formed with a small amount of coating liquid.

The content of fluorine in the fluorosurfactant is preferably from 3% by mass to 40% by mass, more preferably from 5% by mass to 30% by mass, and particularly preferably from 7% by mass to 25% by mass. When the content of fluorine is within this range, it is advantageous in terms of achieving uniform coating thickness and favorable liquid-saving properties, and favorable solubility of the surfactant in the composition.

Examples of the fluorosurfactant include MEGAFAC F171, F172, F173, F176, F177, F141, F142, F143, F144, R30, F437, F479, F482, F780 and F781 (trade name, manufactured by DIC Corporation); FLUORAD FC430, FC431 and FC171 (trade name, manufactured by Sumitomo 3M Co., Ltd.); and SURFLON S-382, SC-101, SC-103, SC-104, SC-105, SC1068, SC-381, SC-383, 5393 and KH-40 (manufactured by Asahi Glass Co., Ltd.)

The use of a fluorosurfactant is particularly preferable in terms of suppressing coating unevenness or thickness unevenness during formation of a thin coating film using the polymerizable composition of the invention. Furthermore, the use of a fluorosurfactant is also effective when the polymerizable composition of the invention is used for slit coating in which discontinuation of liquid supply tends to occur.

The amount of the fluorosurfactant is preferably from 0.001% by mass to 2.0% by mass and more preferably from 0.005% by mass to 1.0% by mass, with respect to the total mass of the polymerizable composition.

Specific examples of the cationic surfactant include a phthalocyanine derivative (commercially-available as EFKA-745, manufactured by Morishita & Co., Ltd.; an organosiloxane polymer (trade name: KP341, manufactured by Shin-Etsu Chemical Co., Ltd.); a (meth)acrylic acid based (co)polymer (trade name: POLYFLOW No. 75, No. 90 and No. 95, manufactured by Kyoeisha Chemical Co., Ltd.; and W001 (trade name, available from Yusho Co., Ltd.)

Specific examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester (trade name: PLURONIC L10, L31, L61, L62, 10R5, 17R2 and 25R2, and TETRONIC 304, 701, 704, 901, 904 and 150R1, manufactured by BASF Corporation).

Specific examples of the anionic surfactant include W004, W005 and W017 (trade name, available from by Yusho Co., Ltd.)

<(L) Other Additives>

The polymerizable composition of the invention may include other known additives, such as an inorganic filler, a plasticizer or an oil-sensitizing agent, in order to improve the physical properties of a cured film.

Examples of the plasticizer include dioctyl phthalate, didodecyl phthalate, triethylene glycol dicaprylate, dimethylglycol phthalate, tricresyl phosphate, dioctyl adipate, dibutyl sebacate, and triacetyl glycerin. When a binder is used, it can be added in an amount of 10% by mass or less, with respect to the total mass of a polymerizable compound and a binder polymer.

As described above, since the polymerizable composition contains a (A) radical photopolymerization initiator having specific physical properties, it can cure at high sensitivity, exhibit excellent internal curability, and suppress coloration due to heat and/or time.

Such a polymerizable composition is useful particularly for forming a colored region of a color filter, since a pattern can be formed with high sensitivity, the adhesion to a substrate is excellent, and coloration of the formed colored cured film is suppressed when it is subjected repeatedly to heating or light irradiation, even when a large amount of colorant is contained. Thus, the polymerizable composition of the invention is suitably used as a polymerizable composition for color filters.

Examples of other applications of the polymerizable composition of the invention include a molding resin, a casting resin, an optical molding resin, a sealing agent, a polymerizable material for dentistries, a printing ink, a paint, a photosensitive resin for printing plates, a color proof for printing, a polymerizable composition for CMOS color filters, a polymerizable composition for CCD color filters, a polymerizable composition for LCD color filters, a resist for black matrices, a resist for printed circuit boards, a resist for manufacturing semiconductors, a resist for microelectronics, a resist for manufacturing micromachine parts, insulation materials, hologram materials, a wafer level lens, waveguide materials, overcoat agents, bonds, adhesives, pressure-sensitive adhesives, and releasable coat agents.

<Color Filter and Method for Manufacturing the Same>

Next, a color filter of the invention and a method for manufacturing the same will be described.

The color filter of the invention has a colored pattern formed on a support, and the colored pattern is formed by using a polymerizable composition for a color filter (the polymerizable composition of the invention).

Hereinafter, the color filter of the invention will be described in detail with reference to a method for manufacturing the same (method for manufacturing the color filter of the invention).

The method for manufacturing a color filter of the invention includes a process for forming a colored polymerizable composition layer by applying the polymerizable composition for color filters of the invention (the polymerizable composition of the invention) n to a support (hereinafter, also referred to as a "polymerizable composition layer formation process"); a process for exposing the polymerizable composition layer in a pattern (hereinafter, also referred to as an "exposure process"); and a process for forming a colored pattern by developing the polymerizable composition layer after exposing the same to light and removing unexposed portions (hereinafter, also referred to as a "development process").

Specifically, the color filter of the invention can be manufactured by applying the polymerizable composition for color filters of the invention onto a support (substrate) directly or via another layer to form a polymerizable composition layer (a polymerizable composition layer formation process); exposing the same through a mask pattern to light so that only exposed portions are cured (exposure process); and developing the same using a developer (development process), thereby forming a patterned coating film formed from pixels of desired colors (for example, three or four colors).

Hereinafter, processes of the method for manufacturing the color filter of the invention will be described.

<Polymerizable Composition Layer Formation Process>

In the polymerizable composition layer formation process, a layer containing a colored polymerizable composition is formed by applying the polymerizable composition for color filters of the invention onto a support.

Examples of the support usable in the invention include soda glass, PYREX (registered trade mark) glass, quartz glass, and products obtained by adhering a transparent conductive film to the same that are used in liquid crystal display devices or the like, substrates for photoelectric transfer elements for use in image pickup elements or the like, such as a silicon substrate or a complementary metal oxide semiconductor (CMOS). On these substrates, black stripes for isolating pixels from each other are formed in some cases.

These supports may also be provided with, as required, an undercoat layer for the purpose of improving the adhesion with respect to an upper layer, preventing diffusion of substance, or flattening the surface of the support.

The application of the polymerizable composition for color filters of the invention onto a support may be carried out by various coating methods, such as slit coating, ink-jetting, spin coating, flow casting, roll coating, and screen printing.

The coating thickness of the polymerizable composition for color filters is preferably from 0.1 μm to 10 μm, more preferably from 0.2 μm to 5 μm, and still more preferably from 0.2 μm to 3 μm.

When manufacturing a color filter for solid-state image sensors, the coating thickness of the polymerizable composition for color filters is preferably from 0.35 μm to 1.5 μm and more preferably from 0.40 μm to 1.0 μm, from the viewpoint of resolution and development properties.

The polymerizable composition for color filters that has been applied onto a support is usually dried under the conditions of from 70° C. to 110° C. and from about 2 minutes to about 4 minutes, whereby a colored polymerizable composition layer is formed.

<Exposure Process>

In the exposure process, the polymerizable composition layer formed in the polymerizable composition layer formation process is exposed to light in a patterned manner. The pattern exposure is usually performed by a method including exposing the layer to light via a mask so that only exposed portions of the layer are cured. However, the pattern exposure may be performed by scanning exposure in some cases according to purposes.

The exposure is preferably performed by radiation irradiation, and the radiation used for exposure is particularly preferably ultraviolet rays such as g-line rays or i-line rays, and a high-pressure mercury lamp is most preferably used. The irradiation intensity is preferably from 5 mJ/cm$^2$ to 1,500 mJ/cm$^2$, more preferably from 10 mJ/cm$^2$ to 1,000 mJ/cm$^2$, and most preferably from 10 mJ/cm$^2$ to 800 mJ/cm$^2$.

<Development Process>

Subsequent to the exposure process, an alkali development treatment (development process) is carried out by allowing the unexposed portions to dissolve in an alkaline aqueous solution. Through this process, only the exposed and cured portions remain on the support.

The developer is desirebly an organic alkaline developer that does not cause damage to a circuit formed underneath or the like. The developing temperature is usually from 20° C. to 30° C. and the developing time is from 20 seconds to 90 seconds.

Examples of the alkali developer include an alkali aqueous solution obtained by diluting an organic alkali compound with purified water so that the concentration of the organic alkali compound is from 0.001% by mass to 10% by mass, preferably from 0.01% by mass to 1% by mass, and examples of the organic alkali compound include aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene. When an alkali aqueous solution as described above is used as a developer, the color filter is usually washed (rinsed) with purified water after the development process.

The method for manufacturing the color filter of the invention may include, after carrying out the colored polymerizable composition layer formation process, the exposure process and the development process, a curing process for curing the formed colored pattern by heating and/or exposing to light, as required.

A color filter having a desired color hue can be produced by repeating the colored polymerizable composition layer formation process, the exposure process and the development process (further, as required, the curing process) for a number of times corresponding to the number of colors that form the color filter.

<Solid-State Image Sensor>

The solid-state image sensor of the invention includes the color filter of the invention.

Since the color filter of the invention is formed from the polymerizable composition for color filters of the invention, the colored pattern exhibits high adhesion with respect to a support and the cured composition exhibits excellent development resistance. Therefore, a pattern having a high resolution that exhibits excellent exposure sensitivity, favorable adhesion of exposed portions with respect to a support, and realizes a favorable cross-sectional shape, can be obtained. Accordingly, the color filter is suitably used for liquid crystal display devices and solid-state image sensors, such as CCD imaging devices, and particularly suitably used for high-resolution CCD imaging devices, CMOS imaging devices or the like that have more than 1 million pixels. More specifically, the color filter of the invention is preferably applied to solid-state image pickup elements.

The color filter of the invention can be used, for example, as a color filter disposed between a light-receiving portion of each pixel and a light-condensing microlens that form a CCD imaging device.

(Cured Film Formed from Polymerizable Composition)

In the invention, one major feature of the cured film formed from the polymerizable composition of the invention is suppressed coloration due to heating after the development and/or a lapse of time. In the invention, the degree of coloration of the cured film can be evaluated by a color difference $\Delta Eab^*$. The color difference $\Delta Eab^*$ can be measured with a colorimeter (MCPD-3000, trade name, manufactured by Otsuka Electronics Co., Ltd.)

The conditions for evaluation are as follows. First, a cured film is formed by exposing the polymerizable composition of the invention at different exposure amounts ranging from 10 $mJ/cm^2$ to 2500 $mJ/cm^2$ with a proximity exposure device (manufactured by Hitachi High-Tech Electronics Engineering Co., Ltd.) with an ultra-high pressure mercury lamp, or an i-line stepper exposure device (365 nm, trade name: FPA-3000i5+, manufactured by Canon Inc.) The obtained cured film is developed as desired, and then heated at 200° C. for 1 hour.

By measuring the color difference $\Delta Eab^*$ of the cured film at different times of before and after the heating, the state of coloration due to heat and/or time of the cured film can be evaluated.

According to the photopolymerizable composition of the invention, the color difference $\Delta Eab^*$ between before and after the heating can be adjusted to 5 or lower.

EXAMPLES

Hereinafter, the present invention will be described in more detail with reference to the Examples. However, the invention is not limited to these Examples. Unless otherwise specified, "parts" and "%" are on the mass basis.

First, details of the (A) radical photopolymerizable initiator having specific physical properties (Specific Compounds 1 to 5) used in the Examples and the comparative compounds (Comparative Compounds 1 to 3) used in the Comparative Examples will be described.

| Compound No. | Structure | Absorpption Coefficient at 365 nm |
|---|---|---|
| Specific Compound 1 | 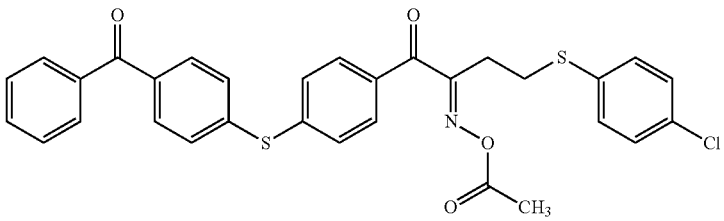 [SMILES: CC(=O)O/N=C(\CCSc1ccc(Cl)cc1)C(=O)c1ccc(Sc2ccc(C(=O)c3ccccc3)cc2)cc1] | 5110 |
| Specific Compound 2 | 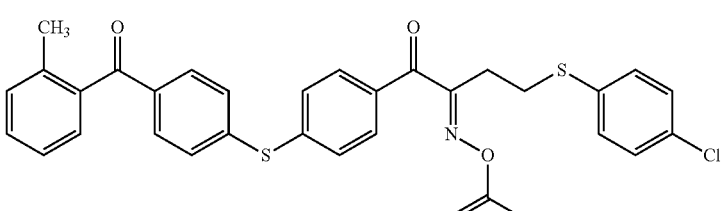 | 4700 |

| Compound No. | Structure | Absorption Coefficient at 365 nm |
|---|---|---|
| Specific Compound 3 | | 4460 |
| Specific Compound 4 | | 4530 |
| Specific Compound 5 | | 4900 |
| Comparative Compound 1 | IRGACURE OXE 01 (manufactured by BASF Japan) | 3300 |
| Comparative Compound 2 | IRGACURE OXE 02 (manufactured by BASF Japan) | 1560 |
| Comparative Compound 3 | | 17800 |

Specific Compounds 1 to 5 described above, which are specific oxime compounds, were synthesized by a method described below.

<Synthesis of Specific Compound 1>

(1. Synthesis of Intermediate (1) of Specific Compound 1)

100.0 g (0.37 mol) of phenylsulfide and 240 ml of chlorobenzene were placed in a 1 L three-necked flask, and then cooled to 0° C. To the above mixture, 74.4 g (0.558 mol) of aluminum chloride were added, and subsequently 77.7 g (0.553 mol) of benzoyl chloride were added dropwise over 30 minutes. The reaction solution was stirred at room temperature for 2 hours.

After cooling the reaction solution to 0° C. again, 78.8 g (0.591 mol) of aluminum chloride were added, and subsequently 83.3 g (0.591 mol) of 4-chlorobutyryl chloride were added dropwise over 30 minutes. The mixture was stirred at room temperature for 2 hours. The reaction solution was added dropwise to a mixture of 3.5 L of water and 570 mL of concentrated hydrochloric acid, and a solid was collected by filtration.

The solid was washed with 300 mL of water, 100 mL of ethyl acetate, and 100 mL of methanol, and then vacuum-dried at 40° C. 169.0 g (0.423 mol, 80% yield) of an intermediate (1) having the following structure was obtained as a white solid.

1H NMR (300 MHz, CDCl3): 2.23 (quintet, 2H), 3.16 (t, 2H), 3.68 (t, 2H), 7.4-7.5 (m, 6H), 7.60 (t, 1H), 7.77 (t, 4H), 7.80 (d, 2H)

Intermediate (1)

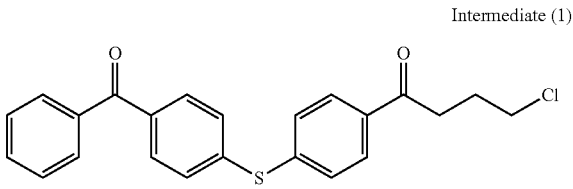 [SMILES: O=C(CCCCl)c1ccc(Sc2ccc(C(=O)c3ccccc3)cc2)cc1]

(2. Synthesis of Intermediate (2) of Specific Compound 1)

100 g (0.253 mol) of the obtained intermediate (1), 38.5 g (0.266 mol) of 4-chlorobenzenethiol, and 3.8 g (0.025 mol) of sodium iodide were charged in a 2 L three-necked flask, and dissolved in 500 mL of THF. The temperature was increased to 40° C. while stirring, and then 11.4 g (0.266 mol) of sodium hydroxide were added. The mixture was allowed to react at 65° C. for 2 hours.

Next, the reaction solution was cooled to 5° C., and then 58.7 g (0.304 mol) of a 28% methanol solution of sodium methoxide were added and stirred at room temperature for 1 hour. Then, the mixture was cooled to 5° C. again, and 35.6 g (0.304 mol) of isopentyl nitrite were added dropwise over 20 minutes. The mixture was allowed to react at room temperature for 2 hours. The reaction solution was added dropwise to a mixed solvent of 4.7 L of water, 40 mL of concentrated hydrochloric acid, 200 mL of acetone, 300 mL of acetonitrile and 100 mL of ethyl acetate, and allowed to crystallize, whereby a crystal was collected by filtration.

Recrystallization was performed with 500 mL of acetonitrile, thereby obtaining 114.6 g (0.215 mol, 85% yield) of an intermediate (2) having the following structure as a pale yellow powder.

1H NMR (300 MHz, CDCl3): 3.03 (t, 2H), 3.15 (t, 2H), 7.2-7.5 (m, 10H), 7.60 (t, 1H), 7.77 (t, 4H), 7.87 (d, 2H), 8.68 (brs, 1H)

Intermediate (2)

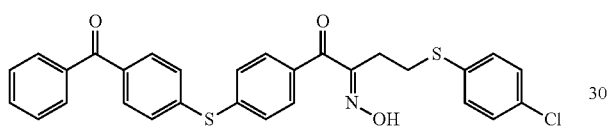

(3. Synthesis of Specific Compound 1)

80 g (0.15 mol) of the obtained Intermediate (2) were suspended in 500 mL of ethyl acetate, and then cooled to 5° C. 18.2 g (0.18 mol) of triethylamine were added thereto, and subsequently 14.1 g (0.18 mol) of acetyl chloride were added. Then, the mixture was stirred at room temperature for 2 hours. The mixture was washed with 300 mL of water, the organic layer was dried with magnesium sulfate, and 350 mL of ethyl acetate were distilled off with an evaporator. The resultant was added dropwise in 2 L of hexane and allowed to crystallize, whereby a crystal was collected by filtration. 74.5 g (0.13 mol, 87% yield) of a photopolymerizable initiator (I-4) were obtained as a pale yellow powder.

1H NMR (300 MHz, CDCl3): 2.18 (s, 3H), 3.13 (m, 4H), 7.26 (m, 4H), 7.39 (d, 2H), 7.52 (m, 4H), 7.61 (t, 1H), 7.83 (d, 4H), 8.04 (d, 2H)

Specific Compound 1

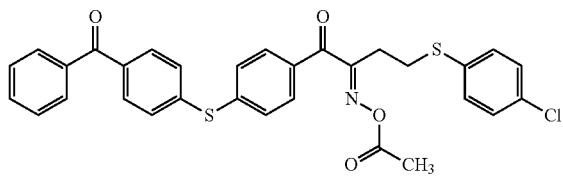

Specific Compounds 2 to 5, which are specific oxime compounds shown above, were synthesized in a similar manner to Synthesis Example 1 as described above, respectively.

The structures of Comparative Compound 1 and Comparative Compound 2 shown above are as follows.

IRGACURE OXE 01

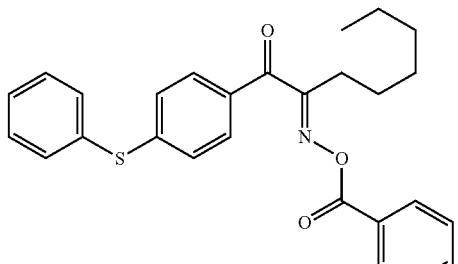

IRGACURE OXE 02

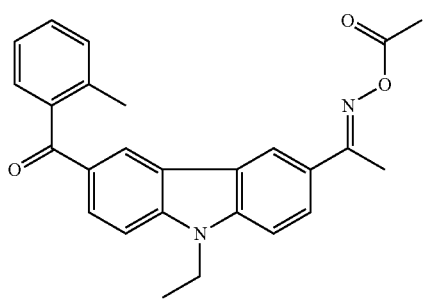

Example 1-1

Green Colored Polymerizable Composition Using Pigment Green 58

1. Preparation of Colored Polymerizable Composition A-1

A negative-type colored polymerizable composition A-1 containing a colorant (pigment) was prepared, and a color filter was produced using the same as a polymerizable composition for forming a color filter.

1-1. Preparation of Pigment Dispersion Liquid (P1)

40 parts of a mixture of C.I. Pigment Green 58 and C. I. Pigment Yellow 180 mixed at a ratio of 30/70 (mass ratio) as a pigment, 10 parts (approximately 4.51 parts in terms of solid content) of BYK2001 (DISPERBYK, trade name, manufactured by BYK-Chemie (BYK), solid content concentration: 45.1% by mass) as a dispersant, and 150 parts of 3-ethoxyethyl propionate as a solvent, were mixed and dispersed for 15 hours with a bead mill, thereby preparing a pigment dispersion liquid (P1).

The average particle diameter of the pigment in the obtained pigment dispersion liquid (P1), as measured by a dynamic light scattering method, was 200 nm.

1-2. Preparation of Colored Polymerizable Composition A-1 (Coating Liquid)

The following components were mixed, thereby preparing a Colored Polymerizable Composition A-1.

<Composition A-1>

| | |
|---|---:|
| Pigment dispersion liquid (P1) | 600 parts |
| Alkali soluble resin (benzyl methacrylate/methacrylic acid/hydroxyethyl methacrylate copolymer, molar ratio: 80/10/10, Mw: 10,000) | 200 parts |
| Polyfunctional monomer: dipentaerythritol hexaacrylate | 60 parts |
| Specific oxime compound: Specific Compound 1 (Photopolymerization initiator) | 60 parts |

| Solvent: propylene glycol monomethyl ether acetate | 1,000 parts |
|---|---|
| Surfactant | 1 part |
| (trade name: TETRANIC 150R[1], available from BASF A.G.) | |
| γ-methacryloxypropyl trimethoxy silane | 5 parts |

2. Production of Color Filter 2-1. Formation of Colored Polymerizable Composition Layer The colored polymerizable composition A-1 containing the pigment obtained as described above was applied, as a resist solution, to a glass substrate having the size of 550 mm×650 mm by slit coating under the following conditions, allowed to stand for 10 minutes, and then vacuum dried and prebaked (100° C., 80 seconds), thereby forming a polymerizable composition coating film (colored polymerizable composition layer).

(Slit Coating Conditions)

Gap of opening of coating head top: 50 μm

Coating rate: 100 mm/sec

Clearance between substrate and coating head: 150 μm

Coating thickness (dried thickness): 2 μm

Coating temperature: 23° C.

2-2. Exposure and Development

Subsequently, the colored polymerizable composition layer was exposed to light in a patterned manner using a 2.5 kW ultra-high pressure mercury lamp. Then, the entire surface of the colored polymerizable composition layer after the exposure was covered with a 10% aqueous solution of an organic developer (trade name: CD, manufactured by FUJIFILM Electronic Materials Co., Ltd.) and allowed to stand for 60 seconds.

2-3. Heat Treatment

Thereafter, the developer was washed off from the colored polymerizable composition layer by showering with purified water, and then the colored polymerizable composition was heated in an oven at 220° C. for 1 hour (post baking). A color filter having a colored pattern on a glass substrate was thus obtained.

3. Performance Evaluation

The storage stability and the exposure sensitivity of the colored polymerizable composition, the developability when the colored pattern was formed on a glass substrate using the colored polymerizable composition, coloration of the obtained colored pattern due to heating with time, the adhesion to a substrate, the shape of cross-section of the pattern, and the shape of cross-section of the pattern after heating were evaluated. The results are shown in Table 1.

3-1. Exposure Sensitivity of Colored Polymerizable Composition

The colored polymerizable composition was applied onto a glass substrate by spin coating, and then dried to form a coating film having a thickness of 1.0 μm. The spin coating was performed for 5 seconds at 300 rpm and then 20 seconds at 800 rpm, and the drying was performed for 80 seconds at 100° C. Next, the obtained coating film was exposed at different exposure amounts ranging from 10 mJ/cm$^2$ to 1600 mJ/cm$^2$ through a test photomask having a line width of 2.0 μm, by a proximity exposure device (manufactured by Hitachi High-Tech Electronics Engineering Co., Ltd.) with an ultra-high pressure mercury lamp. The coating film after exposure was developed under the conditions of 25° C. and 60 seconds using a developer (60% CD-2000, trade name, manufactured by FUJIFILM Electronic Materials Co., Ltd.). The resultant was rinsed with running water for 20 seconds, and then subjected to spray drying, thereby completing the patterning.

The exposure sensitivity was evaluated as the minimum exposure amount at which the pattern line width after the development in the exposed portion was 1 μm or more. The smaller the exposure sensitivity is, the higher the sensitivity is.

3-2. Adhesion Sensitivity

The adhesion sensitivity and the coloration due to forced heating with time were evaluated by observing the surface and the shape of cross-section of the substrate after performing postbaking in 2-3. Heat treatment, according to an ordinary method using an optical microscope and an SEM photograph. The details of the evaluation method are as follows.

The adhesion sensitivity was evaluated based on whether or not there were pattern defects. The exposure amount at which no defects were observed was used as an index of adhesion sensitivity. The smaller the value of adhesion sensitivity was, the more favorable the adhesion was. A favorable result of adhesion indicates that the composition film was cured to a deep portion.

The value of adhesion sensitivity is preferably smaller than the value of exposure sensitivity. When the value of adhesion sensitivity is large and the value of exposure sensitivity is small, exfoliation of the pattern tends to occur due to low curability in a film at an optimal line width, although the line width of the pattern increases at a small exposure amount.

3-3. Evaluation of Coloration Due to Forced Heating with Time

The polymerizable composition layer (colored pattern) after being subjected to exposure, development and postbaking was heated on a hot plate at 200° C. for 1 hour, and then the color difference ΔEab* between before and after the heating was evaluated by a colorimeter (MCPD-3000, trade name, manufactured by Otsuka Electronics Co., Ltd.) based on the following criteria. In the following criteria, A and B indicate acceptable levels in practical applications.

—Evaluation Criteria—

A: ΔEab* 5

B: 5<ΔEab*≤8

C: ΔEab*≥8

Examples 1-2 to 1-10, Comparative Examples 1-1 to 1-3

Colored polymerizable compositions A-2 to A-10 and A'-1 to A'-3 were prepared in a similar manner as Example 1-1, except that the type and the amount of Specific Compound 1 (specific oxime compound) used in composition A-1 were changed to the compound and the amount as shown in Table 1. In Examples 1-6 to 1-10, the type and the amount of the sensitizer and the co-sensitizer were further changed to the compound and the amount shown in Table 1. Color filters were obtained using these compositions. The evaluation was performed in a similar manner to Example 1-1. The results are shown in Table 1.

TABLE 1

| Colored polymerizable composition | Polymerization initiator | | | Sensitizer | | Co-sensitizer | | Exposure sensitivity (mJ/cm$^2$) | Adhesion sensitivity (mJ/cm$^2$) | Coloring changes due to forced heating with time |
|---|---|---|---|---|---|---|---|---|---|---|
| | Specific compound | Comparative compound | Content (Part) | Type | Content (Part) | Type | Content (Part) | | | |
| Ex. 1-1 | A-1 | 1 | — | 60 | — | — | — | — | 500 | 700 | A |
| Ex. 1-2 | A-2 | 2 | — | 60 | — | — | — | — | 600 | 700 | A |
| Ex. 1-3 | A-3 | 3 | — | 60 | — | — | — | — | 500 | 600 | A |
| Ex. 1-4 | A-4 | 4 | — | 60 | — | — | — | — | 700 | 700 | A |
| Ex. 1-5 | A-5 | 5 | — | 60 | — | — | — | — | 800 | 700 | A |
| Ex. 1-6 | A-6 | 1 | — | 60 | A1 | 10 | — | — | 500 | 400 | A |
| Ex. 1-7 | A-7 | 1 | — | 60 | A2 | 10 | — | — | 400 | 300 | A |
| Ex. 1-8 | A-8 | 1 | — | 60 | A3 | 10 | — | — | 400 | 400 | A |
| Ex. 1-9 | A-9 | 1 | — | 60 | A1 | 10 | F1 | 10 | 300 | 200 | A |
| Ex. 1-10 | A-10 | 1 | — | 50 | A1 | 10 | F2 | 10 | 200 | 100 | A |
| Comp. 1-1 | A'-1 | — | 1 | 60 | — | — | — | — | 1500 | 1600 | B |
| Comp. 1-2 | A'-2 | — | 2 | 60 | — | — | — | — | 1000 | 1500 | C |
| Comp. 1-3 | A'-3 | — | 3 | 60 | — | — | — | — | 600 | 1500 | B |

In Table 1 and following Table 2 to 4, the numerical values 1 to 5 in the small column of the Specific Compound in the large column of the Polymerization Initiator refer to Specific Compounds 1 to 5, respectively, and the numerical values 1 to 3 in the column of the Comparative Compound refer to Comparative Compounds 1 to 3, respectively.

The sensitizers A1 to A3 and the co-sensitizers F1 and F2 shown in the Tables represent the following compounds.

A1: 4'4-bisdiethylaminobenzophenone
A2: Diethylthioxanthone

A3:

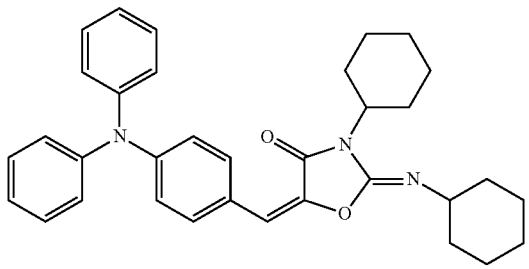

F1: 2-mercaptobenzimidazole
F2: 2-mercaptobenzothiazole
F3: N-phenyl-2-mercaptobenzimidazole
LD-5: 2,2'-bis(o-chlorophenyl)-4,4',5,5'-tetraphenylbiimidazole The results shown in Table 1 indicate that the colored polymerizable compositions prepared in the Examples, each containing a specific oxime compound (Specific Compounds 1 to 5), exhibit high exposure sensitivity, excellent balance with adhesion sensitivity, and suppressed coloration due to heating with time of the colored pattern of the color filter formed from these compositions.

Example 2-1

Blue Colored Polymerizable Composition Using Pyrromethene Dye

1. Preparation of Resist Liquid

The following components were mixed and dissolved, thereby preparing a resist liquid.

<Composition of Resist Liquid>

| | |
|---|---|
| Propylene glycol monomethyl ether acetate (PGMEA) | 19.20 parts |
| Ethyl lactate | 36.67 parts |
| Resin (40% PGMEA solution of benzyl methacrylate/methacrylic acid/2-hydroxyethyl methacrylate (molar ratio = 60/22/18) copolymer) | 30.51 parts |
| Dipentaerythrytol hexaacrylate (polymerizable compound) | 12.20 parts |
| Polymerization inhibitor (p-methoxyphenol) | 0.0061 parts |
| Fluorosurfactant (F-475, trade name, manufactured by DIC Corporation) | 0.83 parts |
| Photopolymerization initiator (TAZ-107, trade name, trihalomethyltriazine-based photopolymerization initiator, manufactured by Midori Chemical Co., Ltd.) | 0.586 parts |

2. Production of Silicon Wafer Substrate with Undercoat Layer

A 6-inch silicon wafer was heat-treated in an oven heated to 200° C. for 30 minutes. Subsequently, the resist liquid was applied onto this silicon wafer so that the dried film thickness was 2 μm, and then the silicon wafer was further heated and dried in an oven heated to 220° C. for 1 hour to form an undercoat layer. Thus, a silicon wafer substrate with an undercoat layer was obtained.

3. Preparation of Colored Polymerizable Composition B-1

The following components were mixed and dissolved, thereby preparing a colored polymerizable composition B-1 containing a colorant (dye).

<Composition B-1>

| | |
|---|---|
| Propylene glycol monomethyl ether acetate (solvent) | 21.09 parts |
| Polymerizable Compound 1 (following structure) | 0.582 part |
| Polymerizable Compound 2 (following structure) | 0.582 part |
| Specific Oxime Compound: Specific Compound 1 (photopolymerization initiator) | 0.360 parts |
| Dye Compound 1 (following structure) | 1.200 parts |
| Pigment Blue-15:6 dispersion liquid (solid content concentration: 13.17%, pigment concentration: 10.13%) | 24.8766 parts |
| Surfactant (trade name: F-781, 1.0% propylene glycol methyl ether acetate solution manufactured by DIC Corporation) | 1.250 parts |

| | |
|---|---|
| p-methoxy phenol 1.0% propylene glycol methyl ether acetate solution | 0.060 parts |

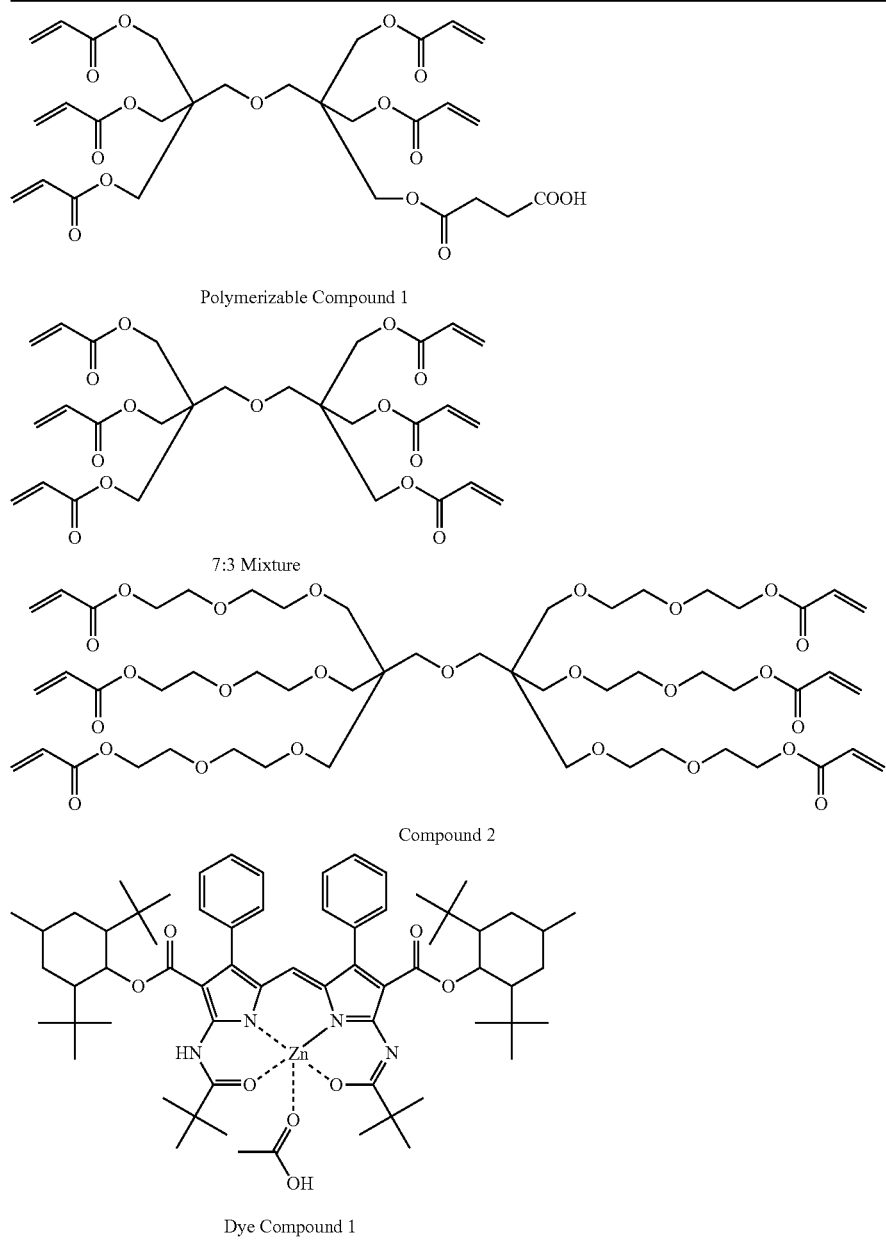

Polymerizable Compound 1

7:3 Mixture

Compound 2

Dye Compound 1

4. Production and Evaluation of Color Filter Using Colored Polymerizable Composition B-1

The colored polymerizable composition B-1 prepared in step 3 was applied onto the undercoat layer formed on the silicon wafer substrate in step 2, thereby forming a photocurable coating film. Then, the silicon wafer was heat-treated (prebaked) for 120 seconds using a hot plate heated to 100° C., so that the dried thickness of the coating film was 0.6 μm.

Subsequently, the resultant was exposed to light at a wavelength of 365 nm at various exposure amounts ranging from 10 to 1600 mJ/cm² through an island pattern mask having the size of 2 μm square using an i-line stepper (FPA-3000i5+, trade name, manufactured by Canon, Inc.)

Thereafter, the silicon wafer substrate having the exposed coating film thereon was placed on a horizontal rotary table of a spin-shower developing device (DW-30, trade name, manufactured by Chemitronics Co., Ltd.), and subjected to paddle development at 23° C. for 60 seconds with a developer (CD-2000, trade name, manufactured by FUJIFILM Electronic Materials Co., Ltd.), thereby forming a colored pattern on the silicon wafer substrate.

The silicon wafer substrate on which the colored pattern was formed was fixed to the horizontal rotary table by a vacuum chuck method. While the silicon wafer substrate was rotated by a rotating device at a rotation rate of 50 r.p.m., a rinse treatment was performed by showering with purified water from nozzles placed above the rotational center of the silicon wafer substrate from, and then the silicon wafer substrate was spray-dried.

Through the above processes, a color filter having a colored pattern formed on a substrate was obtained.

4-1. Exposure Sensitivity

The minimum exposure amount at which the pattern line width after the development in the exposed region was 1.0 µm was used for evaluating exposure sensitivity. The smaller the value of exposure sensitivity is, the higher the sensitivity is.

The pattern line width was measured using a critical dimension SEM (S-9260A, trade name, manufactured by Hitachi High-Technologies Corporation).

The results are shown in Table 2.

4-2, 3. Evaluation of Adhesion Sensitivity and Coloration Due to Heating with Time The adhesion sensitivity and coloring due to heating with time were evaluated based on the evaluation method performed in Example 1-1 and the evaluation criteria of Example 1-1. The results are shown in Table 2.

Examples 2-2 to 2-10 and Comparative Examples 2-1 to 2-3

Colored polymerizable compositions B-2 to B-10 and B'-1 to B'-3 were prepared in a similar manner to Example 2-1, except that 0.360 parts of Specific Compound 1 (specific oxime compound) of the composition B-1 used for the preparation of the colored polymerizable composition B-1 was replaced with the compounds and amounts shown in Table 2. In Examples 2-6 to 2-10, the type and the amount of sensitizers and co-sensitizers shown in Table 2 were used. Color filters were obtained from these compositions, and similar evaluations to Example 2-1 were carried out. The results are shown in Table 2.

and favorable adhesion with respect to the support, even though a dye is used as a colorant instead of a pigment.

Example 3-1

Red Colored Polymerizable Composition

The following components were mixed and dissolved, thereby preparing a colored polymerizable composition C-1 containing a colorant (pigment).

<Composition C-1>

| | |
|---|---|
| 3-ethoxyethyl propionate (solvent) | 17.9 parts |
| Colorant: dispersion of C.I. Pigment Red 254 (solid content: 15% by mass, pigment content in solid content: 60%) | 26.7 parts |
| Colorant: dispersion of C.I. Pigment Yellow 139 (solid content: 15% by mass, pigment content in solid content: 60%) | 17.8 parts |
| Radical polymerizable monomer (polymerizable compound) (mixture of pentaerythritol triacrylate and dipentaerythritol hexaacrylate (3:7)) | 3.5 parts |
| Specific oxime compound: Specific Compound 1 (photopolymerization initiator) | 0.5 parts |
| Benzyl methacrylate/metaacrylic acid copolymer (molar ratio = 70/30) | 2.0 parts |

Examples 3-2 to 3-10, Comparative Examples 3-1 to 3-3

Colored polymerizable compositions C-2 to C-17 and C'-1 to C'-3 were prepared in a similar manner to Example 3-1, except that 0.5 parts of Specific Compound 1 (specific oxime compound) used for preparing the colored polymerizable

TABLE 2

| | | Polymerization initiator | | | Sensitizer | | Co-sensitizer | | Exposure sensitivity ($mJ/cm^2$) | Adhesion sensitivity ($mJ/cm^2$) | Coloring changes due to forced heating with time |
|---|---|---|---|---|---|---|---|---|---|---|---|
| | Polymerizable compound | Specific compound | Comparative compound | Content (Part) | Type | Content (Part) | Type | Content (Part) | | | |
| Ex. 2-1 | B-1 | 1 | — | 0.36 | — | — | — | — | 500 | 700 | A |
| Ex. 2-2 | B-2 | 2 | — | 0.36 | — | — | — | — | 600 | 500 | B |
| Ex. 2-3 | B-3 | 3 | — | 0.36 | — | — | — | — | 800 | 600 | B |
| Ex. 2-4 | B-4 | 4 | — | 0.36 | — | — | — | — | 600 | 500 | A |
| Ex. 2-5 | B-5 | 5 | — | 0.36 | — | — | — | — | 700 | 500 | B |
| Ex. 2-6 | B-6 | 1 | — | 0.31 | A1 | 0.05 | — | — | 500 | 300 | B |
| Ex. 2-7 | B-7 | 1 | — | 0.31 | A2 | 0.05 | — | — | 400 | 400 | A |
| Ex. 2-8 | B-8 | 1 | — | 0.31 | A3 | 0.05 | — | — | 400 | 300 | A |
| Ex. 2-9 | B-9 | 1 | — | 0.31 | A2 | 0.03 | F1 | 0.02 | 200 | 300 | A |
| Ex. 2-10 | B-10 | 1 | — | 0.31 | A1 | 0.03 | F3 | 0.02 | 200 | 200 | A |
| Comp. 2-1 | B'-1 | — | 1 | 0.36 | — | — | — | — | 1700 | 1700 | B |
| Comp. 2-2 | B'-2 | — | 2 | 0.36 | — | — | — | — | 1300 | 1600 | C |
| Comp. 2-3 | B'-3 | — | 3 | 0.36 | — | — | — | — | 500 | 1500 | B |

The sensitizers A1 to A3, the co-sensitizers F1 and F3 shown in Table 2 are described above.

As shown in Table 2, the colored polymerizable composition prepared in the Examples, each containing a specific oxime compound (Specific Compounds 1 to 5), exhibit high curing sensitivity upon exposure, suppressed coloration of the colored pattern of the color filter due to heating with time, composition C-1 was replaced with the compounds and the amounts shown in Table 3. In Examples 3-6 to 3-10, the type and the amount of sensitizers and co-sensitizers shown in Table 4 were used.

The obtained colored polymerizable compositions were evaluated in a similar manner to Example 2-1. The results are shown in Table 3.

TABLE 3

| | Polymerizable compound | Polymerization initiator Specific compound | Polymerization initiator Comparative compound | Content (Part) | Sensitizer Type | Sensitizer Content (Part) | Co-sensitizer Type | Co-sensitizer Content (Part) | Exposure sensitivity (mJ/cm$^2$) | Adhesion sensitivity (mJ/cm$^2$) | Coloring changes due to forced heating with time |
|---|---|---|---|---|---|---|---|---|---|---|---|
| Ex. 3-1 | C-1 | 1 | — | 0.5 | — | — | — | — | 900 | 900 | A |
| Ex. 3-2 | C-2 | 2 | — | 0.5 | — | — | — | — | 1000 | 800 | A |
| Ex. 3-3 | C-3 | 3 | — | 0.5 | — | — | — | — | 900 | 900 | A |
| Ex. 3-4 | C-4 | 4 | — | 0.5 | — | — | — | — | 800 | 900 | A |
| Ex. 3-5 | C-5 | 5 | — | 0.5 | — | — | — | — | 800 | 700 | A |
| Ex. 3-6 | C-6 | 1 | — | 0.4 | A1 | 0.1 | — | — | 600 | 400 | B |
| Ex. 3-7 | C-7 | 1 | — | 0.4 | A3 | 0.1 | — | — | 500 | 400 | B |
| Ex. 3-8 | C-8 | 1 | — | 0.3 | A3 | 0.1 | F1 | 0.1 | 500 | 300 | A |
| Ex. 3-9 | C-9 | 1 | — | 0.3 | A3 | 0.1 | F2 | 0.1 | 600 | 400 | A |
| Ex. 3-10 | C-10 | 1 | — | 0.3 | A3 | 0.1 | LD-5 | 0.1 | 500 | 300 | B |
| Comp. 3-1 | C'-1 | — | 1 | 0.5 | — | — | — | — | 1700 | 1800 | C |
| Comp. 3-2 | C'-2 | — | 2 | 0.5 | — | — | — | — | 1500 | 1800 | C |
| Comp. 3-3 | C'-3 | — | 3 | 0.5 | — | — | — | — | 800 | 1600 | C |

The sensitizers A1 and A3, the co-sensitizers F1, F2 and LD-5 shown in Table 3 are described above.

As shown in Table 3, the colored polymerizable compositions prepared in the Examples, each containing a specific oxime compound (Specific Compounds 1 to 5), exhibit suppressed coloration of the colored pattern of the color filter due to heating with time, and favorable adhesion with respect to the support.

Examples 4-1 to 4-5 and Comparative Examples 4-1 and 4-3

Preparation of Black Polymerizable Composition

<Preparation of Titanium Black Dispersion Liquid A>

The following composition 1 was subjected to a high viscosity dispersion treatment with two rolls, thereby obtaining a dispersion. Prior to the high viscosity dispersion treatment, the composition 1 was kneaded for 30 minutes by a kneader.

<Composition 1>

| | |
|---|---|
| Titanium black (average primary particle diameter: 75 nm, 13M-C, trade name, manufactured by Mitsubishi Materials Corporation) | 35 parts |
| Propylene glycol monomethyl ether acetate | 65 parts |

To the obtained dispersion, the following composition 2 was added and the mixture was stirred for 3 hours using a homogenizer at 3000 rpm. The obtained mixed solution was subjected to a fine dispersion treatment for 4 hours using zirconia beads having a diameter of 0.3 mm with a dispersing device (trade name: DISPERMAT, manufactured by GETZ-MANN), thereby obtaining a titanium black dispersion liquid A (dispersion composition of the invention, hereinafter referred to as a "TB dispersion liquid A").

<Composition 2>

| | |
|---|---|
| 30 wt % propylene glycol monomethyl ether acetate solution of Specific Resin 1 (following structure: x: 50 mol %, y: 50 mol %, Mw: 30,000) | 30 parts |

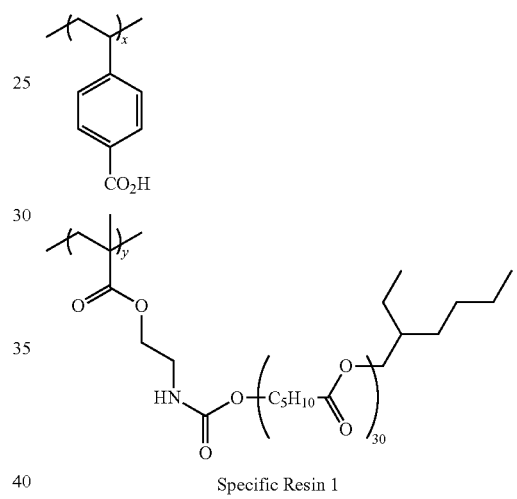

Specific Resin 1

Preparation of Black Polymerizable Compositions D-1 to D-10 and D'-1 to D'-3

The following components were mixed with a stirrer, thereby preparing a black polymerizable composition D-1.

<Composition D-1>

| | |
|---|---|
| Benzyl methacrylate/acrylic acid copolymer (binder polymer) (composition ratio: benzyl methacrylate/acrylic acid copolymer = 80/20 (% by weight), weight average molecular weight: 25,000) | 2.0 parts |
| Dipentaerythritol hexaacrylate (polymerizable compound) | 3.0 parts |
| TB dispersion A (obtained above) | 24.0 parts |
| Propylene glycol monomethyl ether acetate (solvent) | 10 parts |
| Ethyl 3-ethoxy propionate (solvent) | 8 parts |
| Photopolymerization initiator (compound shown in Table 4) | 0.8 parts |
| 4-methoxyphenol (polymerization inhibitor) | 0.01 parts |

Evaluation

Similar evaluations to Example 3-1 were performed using the black polymerizable compositions D-1 to D-10 and D'-1 to D'-3. The results are shown in Table 4.

TABLE 4

| | Black polymerizable compound | Dispersion liquid | Polymerization initiator | | | Sensitizer | | Exposure sensitivity (mJ/cm$^2$) | Adhesion sensitivity (mJ/cm$^2$) |
|---|---|---|---|---|---|---|---|---|---|
| | | | Specific compound | Comparative compound | Content (Part by mass) | Type | Content (Part by mass) | | |
| Ex. 4-1 | D-1 | TB dispersion liquid A | 1 | — | 0.8 | — | — | 900 | 900 |
| Ex. 4-2 | D-2 | TB dispersion liquid A | 2 | — | 0.8 | — | — | 900 | 1100 |
| Ex. 4-3 | D-3 | TB dispersion liquid A | 3 | — | 0.8 | — | — | 900 | 800 |
| Ex. 4-4 | D-4 | TB dispersion liquid A | 4 | — | 0.8 | — | — | 800 | 1200 |
| Ex. 4-5 | D-5 | TB dispersion liquid A | 5 | — | 0.8 | — | — | 900 | 1000 |
| Ex. 4-6 | D-6 | TB dispersion liquid A | 1 | — | 0.8 | F1 | 0.1 | 700 | 900 |
| Ex. 4-7 | D-7 | TB dispersion liquid A | 1 | — | 0.8 | F2 | 0.1 | 700 | 800 |
| Ex. 4-8 | D-8 | TB dispersion liquid A | 1 | — | 0.7 | F3 | 0.1 | 600 | 600 |
| Ex. 4-9 | D-9 | TB dispersion liquid A | 1 | — | 0.6 | F1 | 0.2 | 700 | 700 |
| Ex. 4-10 | D-10 | TB dispersion liquid A | 1 | — | 0.5 | F1 | 0.3 | 600 | 700 |
| Comp. 4-1 | D'-1 | TB dispersion liquid A | — | 1 | 0.8 | — | — | 2000 | 2000 |
| Comp. 4-2 | D'-2 | TB dispersion liquid A | — | 2 | 0.8 | — | — | 1800 | 2000 |
| Comp. 4-3 | D'-3 | TB dispersion liquid A | — | 3 | 0.8 | — | — | 1000 | 1700 |

As is clear from Table 4, the black polymerizable compositions prepared in the Examples, each containing a specific oxime compound (Specific Compounds 1 to 5), exhibit higher exposure sensitivity and superior adhesion sensitivity and internal curability as compared with the Comparative Examples. Accordingly, it is proved that a favorable black pattern (colored pattern) can be formed from the black polymerizable composition of the invention at a small exposure amount.

Example 5

Production of Full-Color Color Filter

On a black matrix formed from a black image pattern containing titanium black as prepared in Example 4-1, a green pattern having the size of 1.2 μm square was formed using the colored polymerizable composition A-1, in a similar manner to Example 1-1.

Further, blue and red colored polymerizable compositions were prepared in a similar manner to the colored polymerizable composition A-1 above, except that only the pigment (mixture of C.I. Pigment Green 58 and C. I. Pigment Yellow 180 (30/70 [mass ratio])) was changed to a blue pigment (mixture of C.I. Pigment Blue 15:6 (pigment) and pyrromethene dye (dye compound 1 above) (30/70 [mass ratio])) and a red pigment (C. I. Pigment Red 254), respectively.

A blue pattern and a red pattern having the size of 1.2 μm square, respectively, were formed on the support in this order in a similar manner to the green pattern formed from the green polymerizable composition A-1, thereby producing a color filter for solid-state image pickup elements.

The shape of cross section and adhesion to the support of the black image pattern and the colored patterns of red, blue and green of the obtained full-color color filter were evaluated in a similar manner to Example 2-1. As a result, it was proved that each pattern exhibited a rectangular shape, no pattern defects, and favorable adhesion with respect to the support.

Example 6

Production of Solid-State Image Sensor

A solid-state image sensor was produced using the color filter obtained in Example 5. As a result, the solid-state image sensor exhibited high resolution and excellent color separation properties.

All publications, patent applications, and technical standards mentioned in this specification are herein incorporated by reference to the same extent as if each individual publication, patent application, or technical standard was specifically and individually indicated to be incorporated by reference.

This application claims priority under 35 USC 119 from Japanese Patent Application No. 2010-19379 filed Jan. 29, 2010, the disclosure of which is incorporated by reference herein.

The invention claimed is:

1. A polymerizable composition comprising (A) a photoradical polymerization initiator represented by following Formula (1), the photoradical polymerization initiator having a molar absorption coefficient with respect to light at a wavelength of 365 nm in ethyl acetate of from 4,000 to less than 10,000; (B) a polymerizable compound; and (C) a colorant:

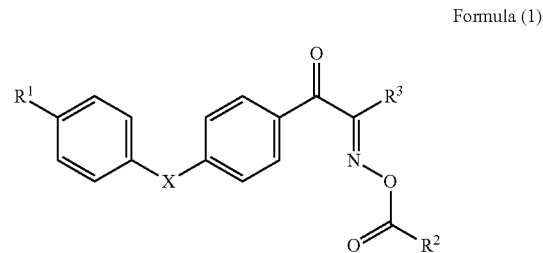

Formula (1)

wherein, in Formula (1), X represents $CH_2$, O or S; $R^1$ represents a halogen atom, a nitro group, a cyano group, or a substituent represented by following Formula (2), Formula (3) or Formula (4); $R_2$ represents an alkyl group, an aryl group, a heteroaryl group, an alkoxy group, an aryloxy group or a heteroaryloxy group; $R^3$ represents an alkyl group having at least one substituent selected from the group consisting of a cyano group, an alkenyl group, an alkynyl group, —$CONR_aR_b$, —$OC(O)R_a$, and —$C(O)OR_a$, wherein $R_a$ and $R_b$ each independently represents a hydrogen atom, an alkyl group, an aryl group or a heteroaryl group:

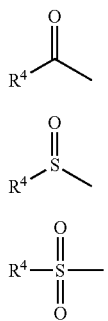

wherein, in Formulae (2) to (4), $R^4$ represents an alkyl group, an aryl group, a heteroaryl group, a hydroxyl group, an alkoxy group, an aryloxy group, a heteroaryloxy group or an amino group.

2. The polymerizable composition according to claim 1, wherein (C) the colorant comprises a dye including zinc.

3. The polymerizable composition according to claim 1, wherein (C) the colorant comprises a pigment including zinc.

4. The polymerizable composition according to claim 3, further comprising (D) a pigment dispersant.

5. The polymerizable composition according to claim 1, wherein (C) the colorant comprises titanium black.

6. The polymerizable composition according to claim 1, for use in forming a colored region of a color filter.

7. A color filter comprising a support and a colored region, the colored region being formed from the polymerizable composition according to claim 1.

8. A solid-state image sensor comprising the color filter according to claim 7.

9. A method of producing a color filter, the method comprising:
forming a polymerizable composition layer by applying the polymerizable composition according to claim 1 on a support;
exposing the polymerizable composition layer to light in a patterned manner; and
forming a color pattern by developing the polymerizable composition layer that has been exposed to light.

10. The polymerizable composition according to claim 1, wherein, in Formula (1), X represents S.

11. The polymerizable composition according to claim 10, wherein in Formula (1), $R^1$ represents a substituent represented by Formula (2) and $R^4$ in Formula (2) represents an aryl group.

12. The polymerizable composition according to claim 1, wherein, in Formula (1), $R^1$ represents a substituent represented by Formula (2).

13. The polymerizable composition according to claim 12, wherein, in Formula (2), $R^4$ represents an aryl group.

* * * * *